(12) United States Patent
Tech et al.

(10) Patent No.: US 12,719,503 B2
(45) Date of Patent: Aug. 25, 2026

(54) CONCEPTS FOR ENCODING AND DECODING NEURAL NETWORK PARAMETERS

(71) Applicant: Fraunhofer-Gesellschaft zur Förderung der angewandten Forschung e.V., Munich (DE)

(72) Inventors: Gerhard Tech, Berlin (DE); Paul Haase, Berlin (DE); Daniel Becking, Berlin (DE); Heiner Kirchhoffer, Berlin (DE); Jonathan Pfaff, Berlin (DE); Karsten Müller, Berlin (DE); Wojciech Samek, Berlin (DE); Heiko Schwarz, Berlin (DE); Detlev Marpe, Berlin (DE); Thomas Wiegand, Berlin (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 27 days.

(21) Appl. No.: 18/767,568

(22) Filed: Jul. 9, 2024

(65) Prior Publication Data

US 2024/0364362 A1 Oct. 31, 2024

Related U.S. Application Data

(63) Continuation of application No. PCT/EP2023/050165, filed on Jan. 5, 2023.

(30) Foreign Application Priority Data

Jan. 9, 2022 (EP) .................................... 22150628

(51) Int. Cl.
*H03M 7/00* (2006.01)
*H03M 7/30* (2006.01)

(52) U.S. Cl.
CPC ................................ *H03M 7/6005* (2013.01)

(58) Field of Classification Search
CPC ........................... H03M 7/6005; H03M 7/079
USPC ..................................................... 341/50, 51
See application file for complete search history.

(56) References Cited

U.S. PATENT DOCUMENTS

| | | | | |
|---|---|---|---|---|
| 12,406,210 | B2 * | 9/2025 | Arpit | G06N 20/20 |
| 2020/0193329 | A1 * | 6/2020 | Osoekawa | G06N 3/0499 |
| 2023/0127031 | A1 * | 4/2023 | Friedenberg | G06N 3/084 706/27 |
| 2023/0177277 | A1 * | 6/2023 | Sen | G06F 40/30 704/9 |

FOREIGN PATENT DOCUMENTS

| | | | |
|---|---|---|---|
| WO | 2020188004 | A1 | 9/2020 |
| WO | 2021123438 | A1 | 6/2021 |

OTHER PUBLICATIONS

S. Chetlur et al., cuDNN: Efficient Primitives for Deep Learning, arXiv: 1410.0759, 2014.

(Continued)

*Primary Examiner* — Peguy Jean Pierre
(74) *Attorney, Agent, or Firm* — PV IP PC; Wei Te Chung

(57) ABSTRACT

Some embodiments relate to a method, a decoder and/or an encoder for entropy coding of parameters of neural networks and their incremental updates, and in particular to reduced value set coding and history depended significance coding.

34 Claims, 16 Drawing Sheets

(56) References Cited

OTHER PUBLICATIONS

MPEG, Text of ISO/IEC FDIS 15938-17 Compression of Neural Networks for Multimedia Content Description and Analysis, Document of ISO/IEC JTC1/SC29/WG11, w20331, OnLine, Apr. 2021.
D. Marpe, H. Schwarz und T. Wiegand, Context-Based Adaptive Binary Arithmetic Coding in the H.264/AVC Video Compression Standard, IEEE transactions on circuits and systems for video technology, vol. 13, No. 7, pp. 620-636, Jul. 2003.
H. Kirchhoffer, J. Stegemann, D. Marpe, H. Schwarz und T. Wiegand, JVET-K0430-v3—CE5-related: State-based probalility estimator, in JVET, Ljubljana, 2018.
ITU—International Telecommunication Union, ITU-T H.265 High efficiency video coding, Series H: Audiovisual and multimedia systems—Infrastructure of audiovisual services—Coding of moving video, Apr. 2015. part 1.
ITU—International Telecommunication Union, ITU-T H.265 High efficiency video coding, Series H: Audiovisual and multimedia systems—Infrastructure of audiovisual services—Coding of moving video, Apr. 2015. part 2.
ITU—International Telecommunication Union, ITU-T H.265 High efficiency video coding, Series H: Audiovisual and multimedia systems—Infrastructure of audiovisual services—Coding of moving video, Apr. 2015. part 3.
ITU—International Telecommunication Union, ITU-T H.265 High efficiency video coding, Series H: Audiovisual and multimedia systems—Infrastructure of audiovisual services—Coding of moving video, Apr. 2015. part 4.
ITU—International Telecommunication Union, ITU-T H.265 High efficiency video coding, Series H: Audiovisual and multimedia systems—Infrastructure of audiovisual services—Coding of moving video, Apr. 2015. part 5.
ITU—International Telecommunication Union, ITU-T H.265 High efficiency video coding, Series H: Audiovisual and multimedia systems—Infrastructure of audiovisual services—Coding of moving video, Apr. 2015. part 6.
ITU—International Telecommunication Union, ITU-T H.265 High efficiency video coding, Series H: Audiovisual and multimedia systems—Infrastructure of audiovisual services—Coding of moving video, Apr. 2015. part 7.
ITU—International Telecommunication Union, ITU-T H.265 High efficiency video coding, Series H: Audiovisual and multimedia systems—Infrastructure of audiovisual services—Coding of moving video, Apr. 2015. part 8.
B. Bross, J. Chen und S. Liu, JVET-M1001-v6-Versatile Video Coding (Draft 4), in JVET, Marrakech, 2019. part 1.
B. Bross, J. Chen und S. Liu, JVET-M1001-v6-Versatile Video Coding (Draft 4), in JVET, Marrakech, 2019. part 2.
B. Bross, J. Chen und S. Liu, JVET-M1001-v6-Versatile Video Coding (Draft 4), in JVET, Marrakech, 2019. part 3.
S. Wiedemann et al., DeepCABAC: A Universal Compression Algorithm for Deep Neural Networks, in IEEE Journal of Selected Topics in Signal Processing, vol. 14, No. 4, pp. 700-714, May 2020.
Working Draft 2 on Incremental Compression of Neural Networks, 136. MPEG Meeting; Oct. 11, 20211-Oct. 15, 2021; Online; (Motion Picture Expert Group or ISO/IEC JTC1/SC29/WG11), ISO IEC 15938-17 No. n20933 Oct. 26, 2021, XP030298292.
MPEG-7, Text of ISO/IEC FDIS 15938-17 Compression of Neural Networks for Multimedia Content Description and Analysis, Document of ISO/IEC JTC1/SC29/WG11, w20331, OnLine, Apr. 2021.
P. Haase et al.: [NNC] CE3-related: CABAC adaptation for binary/ternary codebooks, 137. MPEG Meeting; Jan. 17, 2022-Jan. 21, 2022; Online; (Motion Picture Expert Group or ISO/IEC JTC1/SC29/WG11), No. m58848 Jan. 10, 2022, XP030299540.
International Search Report in International application No. PCT/EP2023/050165,mailed on Apr. 24, 2023.
Written Opinion of the International Search Authority in International application No. PCT/EP2023/050165,mailed on Apr. 24, 2023.
Ties van Rozendaal, et al., Overfitting for Fun and Profit: Instance-Adaptive Data Compression, arxiv.org, Cornell University, Jan. 21, 2021, 2101.08687v1, 1-18, https://arxiv.org/pdf/2101.08687v1.
Japanese Office Action issued in corresponding Japanese Patent Application No. 2024-541196 dated Oct. 7, 2025, pp. 19-29.

* cited by examiner

| int_param(i, maxNumNoRemMinus1, stated, codebookSize, cbZeroOffset ) { | descriptor |
|---|---|
| QuantParam[i] = 0 | |
| if( codebookSize != 1) { | |
| sig_flag | ae(v) |
| if( sig_falg) { | |
| QuantParam[ i ] + + | |
| if( codebookSize > 0 && (cbZeroOffset = = 0 \| \| cbZeroOffset = = codebookSize-1) ) { | |
| signVal = cbZeroOffset != 0 ? 1 : 0 | |
| } | |
| else { | |
| sig_flag | ae(v) |
| signVal = sign_flag | |
| } | |
| j = -1 | |
| if( codebookSize > 0) | |
| maxAbsVal = signVal ? cbZeroOffset : (codebookSize-cbZeroOffset-1) | |
| else | |
| maxAbsVal = -1 | |
| if( maxAbsVal > 1 \| \| maxAbsVal = = +1) { | |
| do { | |
| j + + | |
| abs_level_greater_x[ j ] | ae(v) |
| QuantParam[i] + = abs_level_greater_x[ j ] | |
| } while(abs_level_greater_x[ j ] = = 1 && j < maxNumNoRemMinus1 &&( maxAbsVal > QuantParm[ i ] \| \| maxAbsVal = -1)) | |
| if( abs_level_greater_x[ j ] = = 1 &&(maxAbsVal > QuantParam[i] \| \| maxAbsVal = -1) ) { | |
| RemBits = 0 | |
| j = -1 | |

Fig. 8A

| | |
|---|---|
| do { | |
| j++ | |
| abs_level_greater_x2[ j ] | ae(v) |
| if( abs_level_greater_x2[ j ]){ | |
| QuantParam[ i ] += 1 << RemBits | |
| RemBits++ | |
| } | |
| } while(abs_level_greater_x2[ j ] && j<30( maxAbsVal ≥ (QuantParam[ i ]+(1<< RemBits) ) \| \| maxAbsVal==-1)) | |
| abs_remainder | uae(RemBits) |
| QuantParam[ i ] +=abs_remainder | |
| } | |
| QuantParam[ i ]=signVal?-QuantParam[i]:QuantParam[i] | |
| } | |
| } | |
| } | |

Fig. 8B

| integer_codebook( cbZeroOffset, integerCodebook ) { | descriptor |
|---|---|
| codebook_egk | u(4) |
| codebook_size | ue(2) |
| codebook_centre_offset | ie(2) |
| cbZeroOffset = (codebook_size>>1)+ codebook_centre_offset | |
| codebook_zero_value | ie(7) |
| integerCodebook[cbZeroOffset] = codebook_zero_value | |
| previousValue = integerCodebook[cbZeroOffset] | |
| for( j = cbZeroOffset - 1; j>=0; j-- ){ | |
| codebook_delta_left | ue(codebook_egk) |
| integerCodebook[j] = previousValue- codebook_delta_left-1 | |
| previousValue = integerCodebook[j] | |
| } | |
| previousValue=integerCodebook[cbZeroOffset] | |
| for( j = cbZeroOffset+1; j < codebook_size; j++){ | |
| codebook_delta_right | ue(codebook_egk) |
| integerCodebook[j] = previousValue + codebook_delta_right+1 | |
| previousValue = integerCodebook[j] | |
| } | |
| } | |

Fig. 18

CONCEPTS FOR ENCODING AND DECODING NEURAL NETWORK PARAMETERS

CROSS-REFERENCE TO RELATED APPLICATIONS

This application is a continuation of copending International Application No. PCT/EP2023/050165, filed Jan. 5, 2023, which is incorporated herein by reference in its entirety, and additionally claims priority from European Application No. 22150628.0, filed Jan. 9, 2022, which is also incorporated herein by reference in its entirety.

TECHNICAL FIELD

Some embodiments relate to a method, a decoder and/or an encoder for entropy coding of parameters of neural networks and their incremental updates, and in particular to reduced value set coding and history depended significance coding.

BACKGROUND OF THE INVENTION

Usually, neural networks are equipped with millions of parameters, and may thus require hundreds of MB in order to be represented. MPEG-7 part 17 standard for compression of neural networks for multimedia content description and analysis [2] provides different methods for quantization and integer representation of the neural network parameters, as for example independent scalar quantization and a codebook based integer representation. Additionally, it specifies an entropy quantization scheme also known as deepCABAC [4].

It is desired to provide concepts for improved compression of neural networks, e.g., it is desired to reduce a bit stream and thus a signalization cost for neural networks. Additionally, or alternatively, it is desired to render neural network coding more efficient, e.g., in terms of a reduced bitrate required for the coding.

SUMMARY

An embodiment may have an apparatus for decoding neural network (NN) parameters, which define a neural network, from a data stream, configured for receiving an update parameter for one of the NN parameters, and updating the NN parameter using the update parameter, wherein the apparatus is configured for entropy decoding the update parameter from the data stream, wherein the apparatus is configured for selecting a probability model for the entropy decoding of the update parameter in dependence on a sequence of previous update parameters for the NN parameter, and/or in dependence on the NN parameter.

Another embodiment may have an apparatus for encoding neural network (NN) parameters, which define a neural network, into a data stream, configured for obtaining an update parameter for one of the NN parameters, wherein the apparatus is configured for entropy encoding the update parameter into the data stream, wherein the apparatus is configured for selecting a probability model for the entropy encoding of the update parameter in dependence on a sequence of previous update parameters for the NN parameter, and/or in dependence on the NN parameter.

According to another embodiment, a method for decoding neural network (NN) parameters, which define a neural network, from a data stream may have the steps of: receiving an update parameter for one of the NN parameters, and updating the NN parameter using the update parameter by entropy decoding the update parameter from the data stream by selecting a probability model for the entropy decoding of the update parameter in dependence on a sequence of previous update parameters for the NN parameter, and/or in dependence on the NN parameter.

According to another embodiment, a method for encoding neural network (NN) parameters, which define a neural network, into a data stream may have the steps of: obtaining an update parameter for one of the NN parameters, entropy encoding the update parameter into the data stream by selecting a probability model for the entropy encoding of the update parameter in dependence on a sequence of previous update parameters for the NN parameter, and/or in dependence on the NN parameter.

Another embodiment may have a data stream having encoded thereinto update parameters for encoding neural network (NN) parameters, which define a neural network, the update parameters being encoded into the data stream by obtaining an update parameter for one of the NN parameters, entropy encoding the update parameter into the data stream by selecting a probability model for the entropy encoding of the update parameter in dependence on a sequence of previous update parameters for the NN parameter, and/or in dependence on the NN parameter.

Another embodiment may have a non-transitory digital storage medium having stored thereon a computer program for implementing a method for decoding neural network (NN) parameters, which define a neural network, from a data stream, the method having the steps of: receiving an update parameter for one of the NN parameters, and updating the NN parameter using the update parameter by entropy decoding the update parameter from the data stream by selecting a probability model for the entropy decoding of the update parameter in dependence on a sequence of previous update parameters for the NN parameter, and/or in dependence on the NN parameter, when the computer program is run by a computer or signal processor.

Another embodiment may have a non-transitory digital storage medium having stored thereon a computer program for implementing a method for encoding neural network (NN) parameters, which define a neural network, into a data stream, the method having the steps of: obtaining an update parameter for one of the NN parameters, entropy encoding the update parameter into the data stream by selecting a probability model for the entropy encoding of the update parameter in dependence on a sequence of previous update parameters for the NN parameter, and/or in dependence on the NN parameter, when the computer program is run by a computer or signal processor.

In accordance with a first aspect of the present invention, the inventors of the present application realized that one problem encountered when trying to encode/decode neural network parameters (NN parameters), e.g., using deepCABAC, stems from the fact that currently a certain amount of syntax elements are to be encoded/decoded for the neural network parameters. This may be costly in terms of the memory requirement for storing a representation of a neural network. According to the first aspect of the present application, this difficulty is overcome by enabling an inference of a predetermined syntax element dependent on a mapping scheme used at a quantization/dequantization of neural network parameters. The inventors found, that it is advantageous in terms of memory requirement/signalization costs as well as in terms of a decoding/encoding efficiency to infer a predetermined syntax element instead of encoding/decoding same into/from a data stream. Especially, it was found that a mapping scheme for mapping quantization indices onto reconstruction levels, e.g., at a decoding, or the other way around, e.g., at an encoding, is a good indicator for evaluating whether a predetermined syntax element carries necessary information and should therefore be encoded/decoded for one of the NN parameters or whether the predetermined syntax element is obsolete and can therefore be inferred instead of being encoded/decoded for the respective NN parameter. This is based on the idea that it is possible to derive from the mapping scheme selected for a group of NN parameters information about possible values of the group of NN parameters to be encoded/decoded. Thus it is not necessary to decode/encode a value of a respective NN parameter by decoding/encoding all syntax elements. Instead it is possible to infer one or more of the syntax elements to decode/encode the respective value of the respective NN parameter.

Accordingly, in accordance with a first aspect of the present application, an apparatus for decoding, e.g., referred to as decoder, neural network (NN) parameters, which define a neural network, from a data stream, is configured for obtaining, from the data stream, a mapping scheme for mapping quantization indices onto reconstruction levels and checking whether the mapping scheme fulfills a predetermined criterion. The apparatus for decoding is configured for reconstructing one of the NN parameters by,

- if the mapping scheme fulfills the predetermined criterion, inferring a state of a predetermined syntax element from the mapping scheme, e.g., to be a predetermined state, e.g. a state out of one or more possible states, and subjecting a quantization index derived using the predetermined syntax element to the mapping scheme so as to obtain a reconstruction level, e.g., a reconstruction level of the NN parameter, and
- if the mapping scheme does not fulfill the predetermined criterion, deriving, e.g., or reading, decoding, the predetermined syntax element from the data stream, and subjecting a quantization index derived using the predetermined syntax element to the mapping scheme so as to obtain a reconstruction level, e.g., a reconstruction level of the NN parameter.

Accordingly, in accordance with a first aspect of the present application, an apparatus for encoding, e.g., referred to as encoder, neural network (NN) parameters, which define a neural network, into a data stream, is configured for obtaining a mapping scheme for mapping reconstruction levels onto quantization indices and encoding the mapping scheme into the data stream. The apparatus for encoding may be configured for checking whether the mapping scheme fulfills a predetermined criterion. The apparatus for encoding is configured for encoding one of the NN parameters by subjecting a reconstruction level of the NN parameter to the mapping scheme so as to obtain a quantization index, and

- if the mapping scheme fulfills a, e.g., the, predetermined criterion, skipping an encoding of a predetermined syntax element into the data stream, e.g., so that the predetermined syntax element is to be inferred by a decoder, wherein the predetermined syntax element is part of a representation of the quantization index, and
- if the mapping scheme does not fulfill the predetermined criterion, encoding the predetermined syntax element into the data stream.

An embodiment is related to a method for decoding/encoding neural network (NN) parameters from/into a data stream. The method is based on the same considerations as the above-described encoder/decoder. The method can, by the way, be completed with all features and functionalities, which are also described with regard to the encoder/decoder.

In accordance with a second aspect of the present invention, the inventors of the present application realized that one problem encountered when trying to update neural network parameters (NN parameters) stems from the fact that a large part of the neural network parameters does not change at the update. This may result in high bitrates for coding and signalization of the update, if nevertheless for all NN parameters an update has to be provided. According to the second aspect of the present application, this difficulty is overcome by selecting a probability model for the coding of an update parameter of a NN parameter, for example, in dependence on a current value of the respective NN parameter and/or in dependence on previous update parameters for the respective NN parameter. The inventors found, that the current NN parameter and previous update parameters for the respective NN parameter can give a good indication for the update parameter. Especially, it was found that the usage of such a specially selected probability model can improve a coding efficiency for the respective update parameter. This is based on the idea that the current NN parameter or a history of an updating of the respective NN parameter can allow a better modelling of probabilities. Therefore such a selected probability model provides an optimized probability estimate for the respective update parameter.

Accordingly, in accordance with a second aspect of the present application, an apparatus for decoding, e.g., referred to as decoder, neural network (NN) parameters, which define a neural network, from a data stream, is configured for receiving an update parameter for one of the NN parameters, and updating the NN parameter using the update parameter. The apparatus is configured for entropy decoding the update parameter from the data stream, wherein the apparatus is configured for selecting a probability model, e.g. one out of a set of probability models, for the entropy decoding of the update parameter in dependence on a sequence of previous (e.g., previously received; e.g., the sequence comprises a plurality of update parameters preceding the currently decoded update parameter in a sequence comprising the sequence of previous update parameters, e.g. the update parameters may provide an incremental update for the NN parameter; e.g, the update parameters are updates in the sense of the concept of in section 2.2.1)), update parameters for the NN parameter, and/or in dependence on the NN parameter.

Accordingly, in accordance with a second aspect of the present application, an apparatus for encoding, e.g., referred to as encoder, neural network (NN) parameters, which define a neural network, into a data stream, is configured for obtaining an update parameter for one of the NN parameters. The apparatus is configured for entropy encoding the update parameter into the data stream, wherein the apparatus is configured for selecting a probability model, e.g., one out of a set of probability models, for the entropy encoding of the update parameter in dependence on a sequence of previous, e.g., previously encoded and sent, update parameters for the NN parameter, and/or in dependence on the NN parameter.

An embodiment is related to a method for decoding/encoding neural network (NN) parameters from/into a data stream. The method is based on the same considerations as the above-described encoder/decoder. The method can, by the way, be completed with all features and functionalities, which are also described with regard to the encoder/decoder.

An embodiment is related to a data stream having a picture or a video encoded thereinto using a herein described method for encoding.

An embodiment is related to a computer program having a program code for performing, when running on a computer, a herein described method, when being executed on the computer.

BRIEF DESCRIPTION OF THE DRAWINGS

The drawings are not necessarily to scale, emphasis instead generally being placed upon illustrating the principles of the invention. In the following description, various embodiments of the invention are described with reference to the following drawings, in which:

FIG. 8A and FIG. 8B show an embodiment of a decoding of a quantization index;

FIG. 18 shows an encoding of integer codebooks.

DETAILED DESCRIPTION OF THE INVENTION

Figure 1:
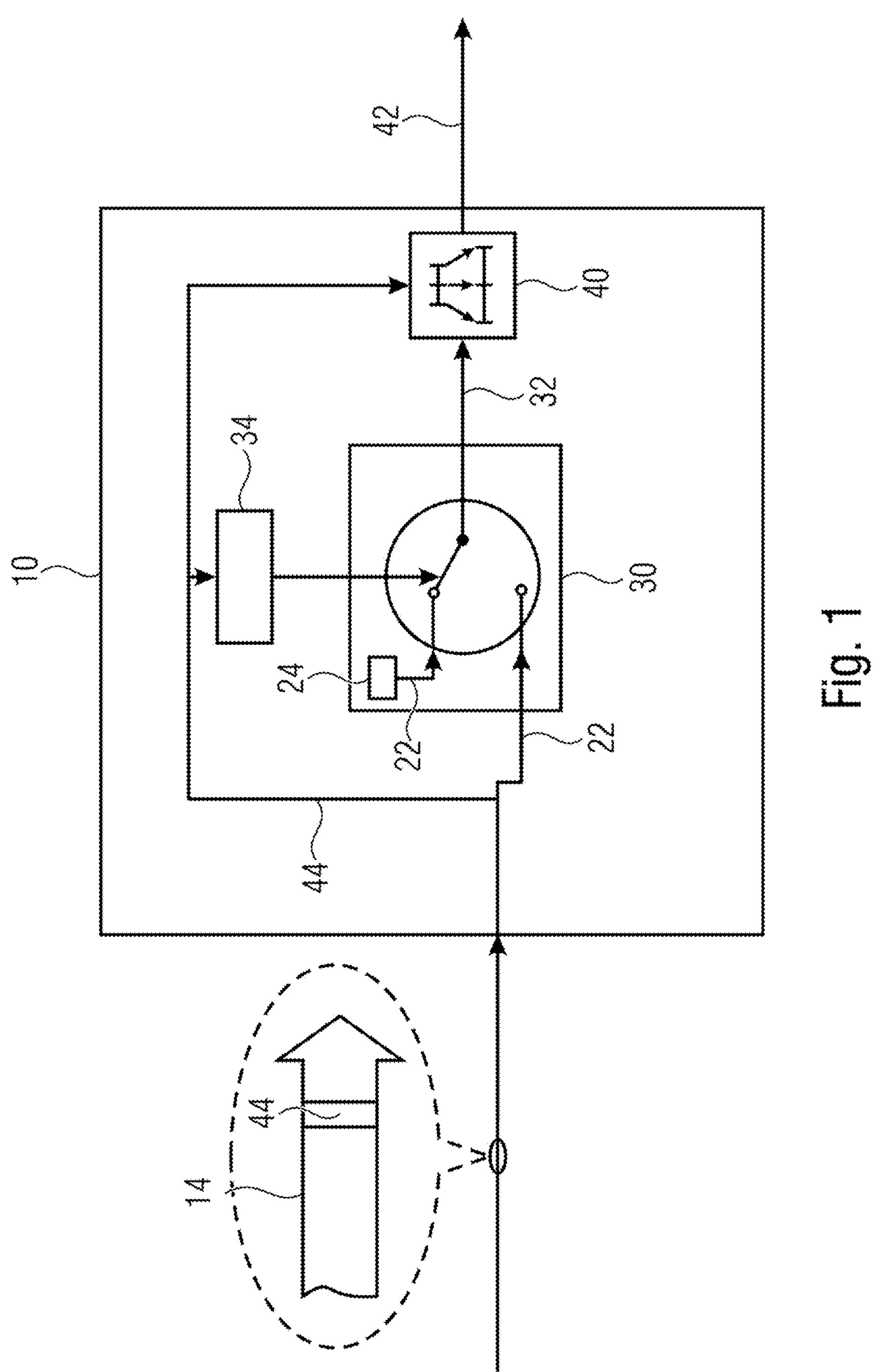
FIG. 1 shows an embodiment of an apparatus for decoding NN parameters dependent on a mapping scheme.

Equal or equivalent elements or elements with equal or equivalent functionality are denoted in the following description by equal or equivalent reference numerals even if occurring in different figures.

In the following, embodiments are discussed in detail, however, it should be appreciated that the embodiments provide many applicable concepts that can be embodied in a wide variety of coding concepts. The specific embodiments discussed are merely illustrative of specific ways to implement and use the present concept, and do not limit the scope of the embodiments. In the following description, a plurality of details is set forth to provide a more thorough explanation of embodiments of the disclosure. However, it will be apparent to one skilled in the art that other embodiments may be practiced without these specific details. In other instances, well-known structures and devices are shown in form of a block diagram rather than in detail in order to avoid obscuring examples described herein. In addition, features of the different embodiments described herein may be combined with each other, unless specifically noted otherwise.

Further embodiments are described by the claims, and by the explanation accompanying the claims.

Embodiments of the invention describe a method for parameter coding of a set of full neural network parameters or incremental updates of a set of neural network parameters, or more specifically, the encoding/decoding of integer indices related to parameters of a neural network. These integer indices may be the output of a quantization process prior to the encoding stage.

Such integer indices may, e.g., denote quantization levels, that can be multiplied with a float-valued quantization step size in order to yield a reconstructed version of the model, or may specify an index, which is then mapped onto a reconstructed weight value using a codebook.

Usually, the integer indices are encoded using an entropy coding method, as for example DeepCABAC, which is also part of MPEG-7 part 17 standard for compression of neural networks for multimedia content description and analysis [2].

Furthermore, the described method can be used in combination with all existing methods for neural network compression (as for example given in MPEG-7 part 17 standard for compression of neural networks for multimedia content description and analysis [2]), provided that the requirements given before are fulfilled.

The described method addresses the entropy coding stage, or more specifically, the binarization process and the context modelling, as it is for example defined by the DeepCABAC entropy coding method, which is based on CABAC [3]. However, the method is applicable to all entropy coding methods using a similar binarization or context modelling process.

The methodology of the apparatus may be divided into different main parts, which consist of the following:

1. Integer Representation (Quantization) of neural network parameters
2. Binarization and Lossless Encoding
3. Lossless Decoding In order to understand the main advantages of the invention, we will firstly give a brief introduction on the topic of neural networks and on related methods for parameter coding.

1 Application Area

Figure 16:
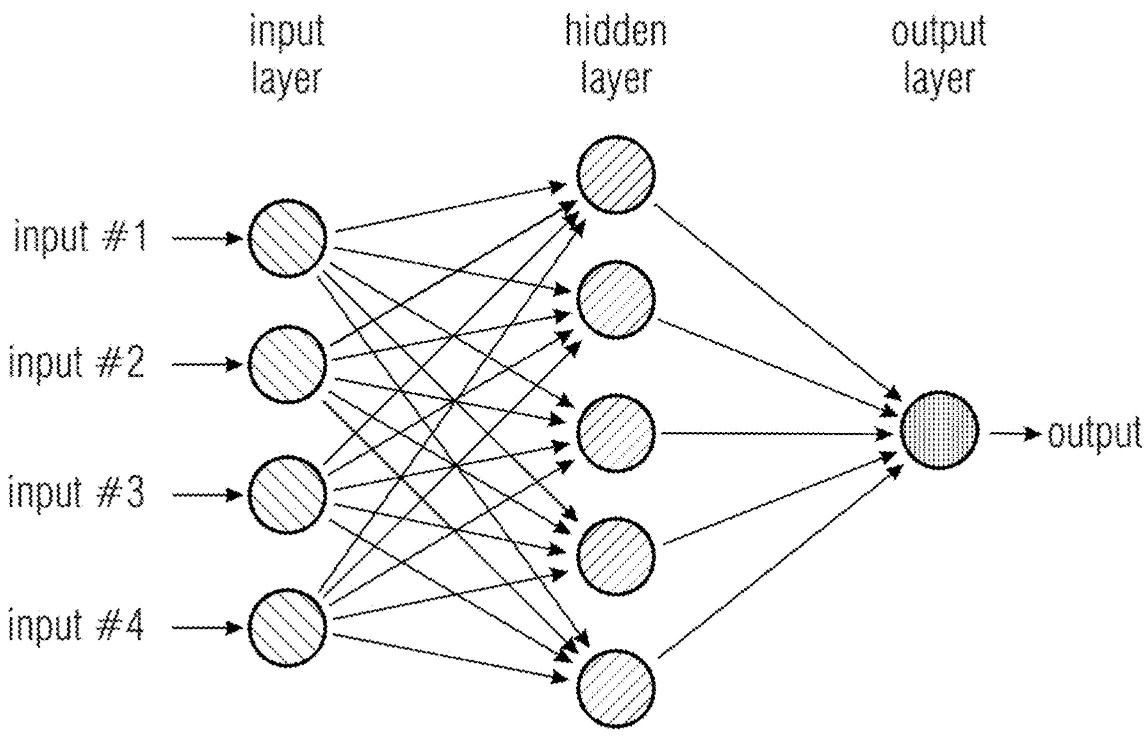
FIG. 16 shows a neural network.

In their most basic form, neural networks constitute a chain of affine transformations followed by an element-wise non-linear function. They may be represented as a directed acyclic graph, as depicted in FIG. 16. Each node entails a particular value, which is forward propagated into the next node by multiplication with the respective weight value of the edge. All incoming values are then simply aggregated. FIG. 16 is an illustration of a 2-layered feed forward neural network, i.e. FIG. 16 shows a graph representation of a feed forward neural network. Specifically, this 2-layered neural network is a non linear function which maps a 4-dimensional input vector into the real line.

Mathematically, the neural network shown in FIG. 16 would calculate the output in the following manner:

$$\text{output} = \sigma(W_2 \cdot \sigma(W_1 \cdot \text{input}))$$

where $W_1$ and $W_2$ are the neural networks weight parameters (edge weights) and sigma σ is some non-linear function. For instance, so-called convolutional layers may also be used by casting them as matrix-matrix products as described in [1]. Incremental updates usually aim at providing updates for the weights of $W_1$ and $W_2$ and can be the outcome of an additional training process. The updated versions of $W_1$ and $W_2$ usually lead to a modified output. From now on, we will refer as inference the procedure of calculating the output from a given input. Also, we will call intermediate results as hidden layers or hidden activation values, which constitute a linear transformation+element-wise non-linearity, e.g., such as the calculation of the first dot product+non-linearity above.

Usually, neural networks are equipped with millions of parameters, and may thus use hundreds of MB in order to be represented. Consequently, they entail high computational resources in order to be executed since their inference procedure involves computations of many dot product operations between large matrices. Hence, it is of high importance to reduce the complexity of performing these dot products.

2 Coding Concepts

In this section, concepts are described, which may optionally be implemented in embodiments according the invention. The concepts may be implemented individually, or in combination.

2.1 Quantization, Integer Representation and Entropy Coding

For example, embodiments may be implemented in accordance with the MPEG-7 part 17 standard for compression of neural networks for multimedia content description and analysis [2], which provides different methods for quantization and integer representation of the neural network parameters, as for example independent scalar quantization and a codebook based integer representation. Additionally, it specifies an entropy quantization scheme also known as deepCABAC [4]. These methods are briefly summarized in this section for a better understanding. Details can be found in [2].

2.1.1 Scalar Quantizers

Figure 17:
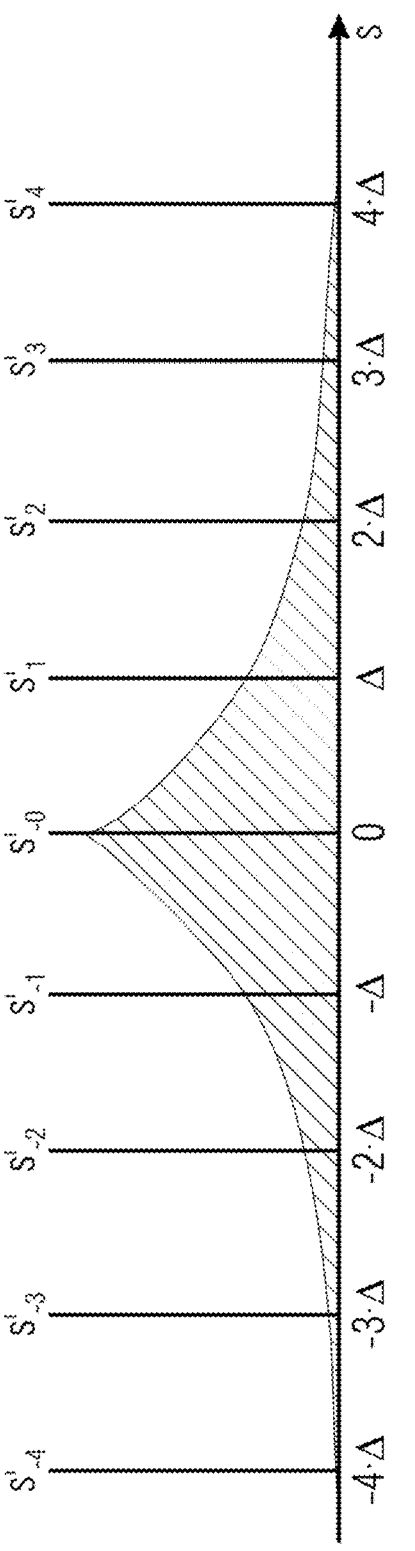
FIG. 17 shows a uniform reconstruction quantizer.

The neural network parameters can be quantized using scalar quantizers. As a result of the quantization, the set of admissible values for the parameters is reduced. In other words, the neural network parameters are mapped to a countable set (in practice, a finite set) of so-called reconstruction levels. The set of reconstruction levels represents a proper subset of the set of possible neural network parameter values. For simplifying the following entropy coding, the admissible reconstruction levels are represented by quantization indexes, which are transmitted as part of the bitstream. At the decoder side, the quantization indexes are mapped to reconstructed neural network parameters. The possible values for the reconstructed neural network parameters correspond to the set of reconstruction levels. At the encoder side, the result of scalar quantization is a set of (integer) quantization indexes. FIG. 17 is an illustration of a uniform reconstruction quantizer.

In embodiments of the present invention uniform reconstruction quantizers (URQs) may optionally be used. Their basic design is illustrated in FIG. 17. URQs have the property that the reconstruction levels are equally spaced. The distance Δ between two neighboring reconstruction levels is referred to as quantization step size. One of the reconstruction levels is equal to 0. Hence, the complete set of available reconstruction levels is uniquely specified by the quantization step size Δ. The decoder mapping of quantization indexes q to reconstructed weight parameters t' is, in principle, given by the simple formula $$t' = q \cdot \Delta.$$

In this context, the term "independent scalar quantization" refers to the property that, given the quantization index q for any weight parameter, the associated reconstructed weight parameter t' can be determined independently of all quantization indexes for the other weight parameters.

2.1.2 Integer Codebook Representation

Instead of directly transmitting the quantization levels, they can be mapped on integer indices using a codebook. Each integer index specifies a position in the codebook which contains the related quantization levels. The integer indices and the codebook are transmitted as part of the bitstream. At the decoder side the integer indices are mapped to quantization levels using the codebook (table look-up), and then, the quantization levels are mapped to reconstructed neural network parameters, using the approach also used for scalar quantization (multiplying a quantization step size which is also part of the bitstream).

The codebook representation may be beneficial for cases, where the number of unique weight parameters is small but the quantization is very fine. In these cases, scalar quantization, e.g. as described in section 2.1.1, may result in a few unique but large quantization levels to be transmitted. With the codebook representation the values to be transmitted can be mapped onto smaller indices.

In other words, according to embodiments, the neural network parameters may be quantized using scalar quantization so as to obtain quantized levels, and subsequently, the quantization levels are mapped onto quantization indices using a codebook, e.g. as described in the following.

The integer indices are encoded using the entropy coding stage, i.e. deepCABAC, in the same manner as it is done for quantization levels output by the quantization stage.

The integer codebooks are encoded as described in the following. integer_codebook( ) is defined as shown in FIG. 18.

For example, the function integerCodebook[j] returns, for each quantization index, an associated value of the reconstruction level or the quantization level associated with the respective quantization index. The quantization indices form a monotonic sequence of integer numbers, wherein the values of the quantization indices are related to their positons within the sequence of integer numbers by the variable cbZeroOffset. For example, as could be seen in FIG. 18, the sequence of integer values to be encoded are contained in the vector integerCodebook where they are ordered in a strict monotonous manner. For encoding, the encoder encodes into the data stream a predetermined integer value, codebook_zero_value, located at a predetermined position, cbZeroOffset, of the sequence of integer values. In examples, the predetermined position is the position within the monotonic sequence of integer numbers being associated with the value zero.

In the example of FIG. 18, the positions of the sequence of integer values, which precede the predetermined position, cbZeroOffset, are coded first in the first for-loop. In particular, for each such position j, a first difference between an integer value residing immediately following the respective position, here stored in previousValue as the for-loop traverses these positions towards the beginning of the sequence of integer values, and the integer value at the respective position, integerCodebook[j], reduced by 1 is calculated and the first difference is coded into the data stream, i.e. codebook_delta_left=previousValue−integerCodebook[j]−1. Then, the positions of the sequence of integer values, which are located following the predetermined position, are coded first in the second for-loop. For each such position of the sequence of integer values, a second difference between the integer value at the respective position, integerCodebook [j], and an integer value residing immediately preceding the respective position, here stored in previousValue as the for-loop traverses these positions towards the end of the sequence of integer values and is initialized with the predetermined integer value, codebook_zero_value, right before the second for-loop, reduced by 1, is calculated and the second difference is coded into the data stream, i.e. codebook_delta_right=integerCodebook[j]−previousValue−1. As mentioned before, the order among coding the differences could be switched or even be interleaved. For decoding the sequence of integer values, the predetermined integer value, codebook_zero_value, located at the predetermined position, cbZeroOffset, of the sequence of integer values is decoded from the data stream. Then, for each position of the sequence of integer values which precedes the predetermined position, a first difference between an integer value residing immediately following the respective position and the integer value at the respective position, reduced by 1, is decoded from the data stream, i.e. codebook_delta_left=previousValue−integerCodebook[j]−1, and for each position of the sequence of integer values which is located following the predetermined position, a second difference between the integer value at the respective position and an integer value residing immediately preceding the respective position, reduced by 1, is decoded from the data stream, namely codebook_delta_right=integerCodebook[j]−previousValue−1.

In more detail, the number of integer values of the sequence of integer values is also coded into data stream, namely codebook_size. This is done using a variable length code, namely a 2-th order Exp-Golomb code.

Information on the predetermined position, codebook_centre_offset, of the encoded sequence of integer values may be also coded into the data stream. This coding is done differentially relative to the sequence's mid position. That is, cbZeroOffset-(codebook_size>>1)=codebook_centre_offset is coded, i.e. a difference between a rank of the predetermined position, cbZeroOffset, and an integer-rounded half, here a rounded off half, of the number of integer values, namely codebook_size>>1. This is done using a variable length code, namely a 2-th order Exp-Golomb code.

The predetermined integer value, codebook_zero_value, is coded using a 7-th order Exp-Golomb code.

The first and second differences are coded using a k-th order Exp-Golomb code with k being coded into the data stream as codebook_egk. It is coded as a 4 bit unsigned integer.

An encoded sequence of integer values, e.g. a codebook, (integer_codebook) is defined by variables cbZeroOffset and integerCodebook—a predetermined position of the sequence of integer values, e.g. z, and a predetermined integer value located at the predetermined position, e.g. C(z).

Parameters defining the sequence, e.g. the codebook, include an exponential Golomb code parameter, e.g. an Exp-Golomb code parameter, e.g. k, (codebook_egk) and a number of integer values of the sequence of integer values, e.g. a number of elements in the codebook, (codebook_size). These parameters are decoded from the data stream, e.g. the bitstream, to be used in creating a decided sequence of integer values.

The predetermined position (cbZeroOffset) is a variable (codebook_centre_offset) calculated using a difference (codebook_centre_offset) between a rank of the predetermined position and an integer-rounded half of the number of integer values, which is encoded in a bitstream. The variable codebook_centre_offset is defined as a third difference, e.g. y, in an embodiment. The variable codebook_centre_offset specifies an offset for accessing integer values in the sequence, e.g. elements in the codebook, relative to the centre of the sequence, e.g. the codebook. The difference (codebook_centre_offset) is decoded from the data stream, e.g. the bitstream, to be used in creating a decided sequence of integer values.

Parameter codebook_zero_value defining the encoded sequence, e.g. the codebook, specifies the predetermined integer value (integerCodebook) located at the predetermined position (cbZeroOffset), e.g. the value of the codebook at position CbZeroOffset. This parameter is involved in creating a decoded sequence of integer values, e.g. a variable Codebook (the array representing the codebook).

In creating a decoded sequence a first difference (codebook_delta_left) and a second difference (codebook_delta_right) are decoded from the data stream, e.g. the bitstream.

The first difference (codebook_delta_left) specifies a difference between an integer value residing immediately following the respective position and the integer value at the respective position, reduced by 1 for each position of the sequence of integer values which precedes the predetermined position (cbZeroOffset), e.g. the difference between a codebook value and its right neighbour minus 1 for values left to the centre position. The first difference (codebook_delta_left) is involved in creating the decoded sequence of integer values, e.g. a variable Codebook (the array representing the codebook), as shown in FIG. 18. For each position of the sequence of positions which precedes the predetermined position (cbZeroOffset), the integer value at the respective position is computed by linearly combining the first difference (codebook_delta_left), the integer value residing immediately following the respective position (previousValue=integerCodebook[j+1]) and one:

$$integerCodebook[j] = previousValue - \text{codebook\_delta\_left} - 1.$$

The second difference (codebook_delta_right) specifies a difference between the integer value at the respective position and an integer value residing immediately preceding the respective position, reduced by 1 for each position of the sequence of integer values which is located following the predetermined position (cbZeroOffset), e.g. the difference between a codebook value and its left neighbour minus 1 for values right to the centre position. The second difference is involved in creating the decoded sequence of integer values, e.g. a variable Codebook (the array representing the codebook), as shown in FIG. 18. For each position of the sequence of integer values which is located following the predetermined position (cbZeroOffset), the integer value at the respective position is computed by linearly combining the second difference (codebook_delta_right), the integer value residing immediately preceding the respective position (previousValue=integerCodebook[j−1]) and one:

$$integerCodebook[j] = previousValue + \text{codebook\_delta\_right} + 1.$$

The exponential Golomb code parameter (codebook_egk) is used for decoding of syntax elements codebook_delta_left defining the first difference and codebook_delta_right defining the second difference.

2.1.3 Entropy Coding

As a result of the quantization, applied in the previous step, the weight parameters are mapped to a finite set of so-called reconstruction levels. Those can be represented by an (integer) quantizer index (also referred to as quantization index (e.g. in the above described scalar quantization), or integer index (e.g., if an integer codebook is used as described above), or as parameter level or weight level) and the quantization step size, which may, for example, be fixed for a whole layer. In order to restore all quantized weight parameters of a layer, the step size and dimensions of the layer may be known by the decoder. They may, for example, be transmitted separately.

2.1.3.1 Binarization and Encoding of Quantization Indexes or Integer Indices with Context-Adaptive Binary Arithmetic Coding (CABAC)

The quantization indexes (integer representation) or (codebook) integer indices are then transmitted using entropy coding techniques. Therefore, a layer of weights is mapped onto a sequence of quantized weight levels, e.g. the quantization indexes or integer indices, using a scan. For example, a row first scan order can be used, starting with the upper-most row of the matrix, encoding the contained values from left to right. In this way, all rows are encoded from the top to the bottom. Note that any other scan can be applied. For example, the matrix can be transposed, or flipped horizontally and/or vertically and/or rotated by 90/180/270 degree to the left or right, before applying the row-first scan. Optionally, the quantization levels can be mapped onto integer indices using a codebook. In the following, we refer to a value to be encoded as index, regardless of whether it is a quantized weight level or a codebook integer index.

For example, the NN parameters, e.g. the NN parameters of one layer of the NN, may be represented in a 2D matrix, in which one row comprises NN parameters related to exactly one output neuron of the neural network. For example, for one output neuron, the row may comprise one or more parameters, e.g. weights, for each of one input neuron of the output neuron.

For example, for coding of the indices CABAC (Context-Adaptive Binary Arithmetic Coding) is used. Refer to [2] for details. So, an index to be transmitted q is decomposed in a series of binary symbols or syntax elements, which then may be handed to the binary arithmetic coder (CABAC).

In the first step, a binary syntax element sig_flag is derived for the index, which specifies whether the corresponding index is equal to zero. If the sig_flag is equal to one a further binary syntax element sign_flag is derived. The bin indicates if the current index is positive (e.g., bin=0) or negative (e.g., bin=1).

Next, a unary sequence of bins is encoded, followed by a fixed length sequence as follows:

A variable k is initialized with a non-negative integer and X is initialized with 1<<k.

One or more syntax elements abs_level_greater_X are encoded, which indicate, that the absolute value of the index is greater than X. If abs_level_greater_X is equal to 1, the variable k is updated (for example, increased by 1), then 1<<k is added to X and a further abs_level_greater_X is encoded. This procedure is continued until an abs_level_greater_X is equal to 0. Afterwards, a fixed length code of length k suffices to complete the encoding of the index. For example, a variable rem=X−|q| could be encoded using k bits. Or alternatively, a variable rem' could be defined as rem'=(1<<k)−rem−1 which is encoded using k bits. Any other mapping of the variable rem to a fixed length code of k bits may alternatively be used.

When increasing k by 1 after each abs_level_greater_X, this approach is identical to applying exponential Golomb coding (if the sign_flag is not regarded).

2.1.3.2 Decoding of Quantization Indexes with Context-Adaptive Binary Arithmetic Coding (CABAC)

Decoding of the indices (integer representation) works analogously to the encoding. The decoder first decodes the sig_flag. If it is equal to one, a sign_flag and a unary sequence of abs_level_greater_X follows, where the updates of k, (and thus increments of X) must follow the same rule as in the encoder. Finally, the fixed length code of k bits is decoded and interpreted as integer number (e.g. as rem or rem', depending on which of both was encoded). The absolute value of the decoded index |q| may then be reconstructed from X, and form the fixed length part. For example, if rem was used as fixed-length part, |q|=X−rem. Or alternatively, if rem' was encoded, |q|=X+1+rem'−(1<<k). As a last step, the sign needs to be applied to |q| in dependence on the decoded sign_flag, yielding the index q. Then, whenever the index refers to a codebook index, a quantized weight level $q_{Quant}$ can be obtained by a codebook table look-up. Finally, the quantized weight w is reconstructed by multiplying the quantized weight level $q_{Quant}$ with the step size Δ.

Context Modelling

In the CABAC entropy coding, most syntax elements for the quantized weight levels are coded using a binary probability modelling. Each binary decision (bin) is associated with a context. A context represents a probability model for a class of coded bins. The probability for one of the two possible bin values is estimated for each context based on the values of the bins that have been already coded with the corresponding context. Different context modelling approaches may be applied, depending on the application. Usually, for several bins related to the quantized weight coding, the context, that is used for coding, is selected based on already transmitted syntax elements. Different probability estimators may be chosen, for example SBMP [4], or those of HEVC [5] or VTM-4.0 [6], depending on the actual application. The choice affects, for example, the compression efficiency and complexity.

A context modeling scheme that fits a wide range of neural networks is described as follows. For decoding a quantized weight level q at a particular position (x,y) in the weight matrix (layer), a local template is applied to the current position. This template contains a number of other (ordered) positions like e.g. (x−1, y), (x, y−1), (x−1, y−1), etc. For each position, a status identifier is derived.

In an implementation variant (denoted Si1), a status identifier $s_{x,y}$ for a position (x,y) is derived as follows: If position (x,y) points outside of the matrix, or if the quantized weight level $q_{x,y}$ at position (x,y) is not yet decoded or equals zero, the status identifier $s_{x,y}=0$. Otherwise, the status identifier shall be $s_{x,y}=q_{x,y}<0?1:2$.

For a particular template, a sequence of status identifiers is derived, and each possible constellation of the values of the status identifiers is mapped to a context index, identifying a context to be used. The template, and the mapping may be different for different syntax elements. For example, from a template containing the (ordered) positions (x−1, y), (x, y−1), (x−1, y−1) an ordered sequence of status identifiers $s_{x-1,y}$, $s_{x,y-1}$, $s_{x-1,y-1}$ is derived. For example, this sequence may be mapped to a context index $C=s_{x-1,y}+3*s_{x,y-1}+9*s_{x-1,y-1}$. For example, the context index C may be used to identify a number of contexts for the sig_flag.

In an implementation variant (denoted approach 1), the local template for the sig_flag or for the sign_flag of the quantized weight level $q_{x,y}$ at position (x,y) consists of only one position (x−1, y) (i.e., the left neighbor). The associated status identifier $s_{x-1,y}$ is derived according to the implementation variant Si1.

For the sig_flag, one out of three contexts is selected depending on the value of $s_{x-1,y}$ or for the sign_flag, one out of three other contexts is selected depending on the value of $s_{x-1,y}$.

In another implementation variant (denoted approach 2), the local template for the sig flag contains the three ordered positions (x−1, y), (x−2, y), (x−3, y). The associated sequence of status identifiers $s_{x-1,y}$, $s_{x-2,y}$, $s_{x-3,y}$ is derived according to the implementation variant Si2.

For the sig_flag, the context index C is derived as follows: If $s_{x-1,y}\neq 0$, then C=0. Otherwise, if $s_{x-2,y}\neq 0$, then C=1. Otherwise, if $s_{x-3,y}\neq 0$, then C=2. Otherwise, C=3.

This may also be expressed by the following equation:

$$C = (s_{x-1,y} \neq 0)?\ 0:((s_{x-2,y} \neq 0)?\ 1:((s_{x-3,y} \neq 0)?\ 2:3))$$

In the same manner, the number of neighbors to the left may be increased or decreased so that the context index C equals the distance to the next nonzero weight to the left (not exceeding the template size).

2.2 Incremental Neural Network Coding

2.2.1 Concept of Base Model and Update Models

The concept introduces a neural network model according to section 1 which can be considered as a full model in a sense that an output can be computed on a given input. This model is denoted as base model $N_B$. Each base model consists of layers, which are denoted as base-layers $L_{B1}$, $L_{B2}$, . . . , $L_{BJ}$. A base-layer contains base values, that may, for example, be chosen such that they can efficiently be represented or compressed/transmitted in a first step. Additionally, the concept introduces update models ($N_{U1}$, $N_{U2}$, . . . , $N_{UK}$), which may have a similar or even identical architecture as the base model. The update model may, for example, not be a full model in sense mentioned above. Instead, it may be combined with a base model using a composition method, such that they form a new full model $N_{B1}$. This model itself can serve as base model for further update models. An update model $N_{Uk}$ consists of layers, denoted as update layers $L_{Uk,1}$, $L_{Uk,2}$, . . . , $L_{Uk,J}$. An update layer contains base values, that may, for example, be chosen such that they can efficiently be represented or compressed/transmitted separately.

The update model may be the outcome of an (additional) training process applied to the base model at the encoder side. Several composition methods, depending on the type of updates provided by the update model may be applied. Note that the methods described within this invention are not restricted to any specific type of updates/composition method, but are applicable to any architecture using the base model/update model approach.

In an advantageous embodiment the k-th update model $N_{Uk}$ contains layers $L_{Uk}j$ (index j identifies the individual layers) with differential values (also denoted as incremental updates) that are added to corresponding layers of a base model $L_{Bj}$ to form a new model layers $L_{Nk,j}$ according to:

$$L_{Nkj} = L_{Bj} + L_{Uk,j},\quad \text{for all } j$$

The new model layers form the (updated) new model, which then serves as base model for a next incremental update, which is transmitted separately.

In a further advantageous embodiment the k-th update model contains layers $L_{Uk,j}$ with scaling factor values that are multiplied by the corresponding base layer $L_{Bj}$ values to form a new model $L_{Nk,j}$ according to:

$$L_{Nk,j} = L_{Bj} \cdot L_{Uk,j},\quad \text{for all } j$$

The new model layers form the (updated) new model, which then serves as base model for a next incremental update, which is transmitted separately.

Note, that in some cases, an update model may also contain new layers, which replace one or more existing layers (i.e. for a layer k: $L_{Nk,j}=L_{Uk,j}$, for all j), instead of updating a layer as described above.

2.2.2 Neural Network Parameter Coding of Incremental Updates

The concept of a base model and one or more incremental updates can be exploited in the entropy coding stage in order to improve the coding efficiency. The parameters of a layer are usually represented by a multidimensional tensor. For the encoding process all tensors are usually mapped to a 2D matrix, such that entities like rows and columns. This 2D matrix is then scanned in a predefined order and the parameters are encoded/transmitted. Note that the methods described in the following are not restricted to 2D matrices. The methods are applicable to all representations of neural network parameters that provides parameter entities of known size, like e.g. rows, columns, blocks etc. and/or a combination of them. The 2D Matrix representation is used in the following for a better understanding of the methods.

In an advantageous embodiment the parameters of a layer are represented as a 2D matrix, which provides entities of values like rows and columns.

2.2.2.1 Improved Context Modeling for the Base-Model Update Model Structure

The concept of base models and one or more update models can be exploited in the entropy coding stage. The methods described here are applicable to any entropy coding scheme that uses context models, as for example the one described in section 2.1.4.

Usually the separate update models (and the base model) are correlated and available at the encoder and decoder side. This can be used in the context modeling stage to improve the coding efficiency by providing new context models and methods for context model selection.

In an advantageous embodiment, a binarization (sig_flag, sign_flag, etc.), context modeling and encoding scheme according section 2.1.3.1 is applied.

In another advantageous embodiment, the given number of context models (context set) for a symbol to be encoded is duplicated forming two or more sets of context models. Then a set of context models is chosen based on the value of a co-located parameter in a corresponding layer of a specific previously encoded update or the base model. That means a first set is chosen if the co-located parameter is lower than a first threshold $T_1$, a second set if the value is greater or equal than threshold $T_1$, a third set if the value is greater or equal than a threshold $T_2$ etc. This procedure may be applied with more or less threshold values.

In an advantageous embodiment which is equal to the previous embodiment, a single threshold $T_1=0$ is used.

In a further advantageous embodiment, the given number of context models (context set) for a symbol to be encoded is duplicated forming two or more sets of context models. Then a set of context models is chosen based on the absolute value of a co-located parameter in a corresponding layer of a specific previously encoded update or the base model. That means the first set is chosen if the absolute value of the co-located parameter is lower than a first threshold $T_1$, a second set if the absolute value is greater or equal another threshold $T_1$, a third set if the absolute value is greater or equal than a threshold $T_2$ etc. This procedure may be applied with more or less threshold values.

In an advantageous embodiment which is equal to the previous embodiment a sig_flag is encoded which indicates if a current value to be encoded is equal to zero or not, which employs a set of context models. The embodiment uses a single threshold $T_1=1$.

Another advantageous embodiment is equal to the previous embodiment, but instead of a sig_flag, a sign_flag is encoded which indicates the sign of a current value to be encoded.

A further advantageous embodiment is equal to the previous embodiment, but instead of a sig_flag, an abs_level_greater_X is encoded which indicates whether the current value to be encoded is greater than X.

In a further advantageous embodiment, the given number of context models (context set) for a symbol to be encoded is doubled forming two sets of context models. Then a set of context models is chosen depending on whether there is a corresponding previously encoded update (or base) model or not. The first set of context models is chosen if there is not a corresponding previously encoded update (or base) model, and the second set, otherwise.

In another advantageous embodiment, a context model out of a set of context models for a syntax element is chosen based on the value of a co-located parameter in a specific corresponding previously encoded update (or base) model. That means a first model is chosen if the co-located parameter is lower than a threshold $T_1$, a second model if the value is greater or equal than threshold $T_1$, a third set if the value is greater or equal than another threshold $T_2$ etc. This procedure may be applied with more or less threshold values.

In an advantageous embodiment equal to the previous embodiment a sign_flag is encoded which indicates the sign of a current value to be encoded. A first threshold for the context model selection process is $T_1=0$ and a second threshold is $T_2=1$.

In another advantageous embodiment a context model out of a set of context models for a syntax element is chosen based on the absolute value of a co-located parameter in a specific corresponding previously encoded update (or base) model. That means a first model is chosen if the absolute value of the co-located parameter is lower than a threshold $T_1$, a second model if the value is greater or equal than threshold $T_1$, a third model if the value is greater or equal than threshold $T_2$ etc. This procedure may be applied with more or less threshold values.

In an advantageous embodiment equal to the previous embodiment a sig_flag is encoded which indicates whether a current value to be encoded is equal to zero or not. It employs a first threshold set to $T_1=1$ and second threshold set to $T_2=2$.

In another advantageous embodiment equal to the previous embodiment instead of a sig_flag a abs_level_greater_X flag is encoded which indicates whether a current value to be encoded is greater than X. Additionally only one threshold is employed which is set to $T_1=X$.

Note that any of the above mentioned embodiments can be combined with one or more of the other embodiments.

3 Invention Aspect 1: Reduced Value Set Coding

This invention describes a modified binarization scheme for encoding of quantized weight levels or integer indices, respectively, for cases where there are information about the possible values to be encoded/decoded available at the encoder and the decoder. For example, there are cases where all indices to be encoded/decoded are non-positive or non-negative, respectively. Hence, the sign_flag would carry no information and can be considered obsolete. Another example is, when the maximum absolute level of all values to be transmitted is given. In this case, the number of abs_level_greater_X_flags may be reduced.

In the next section (sec 3.1) the modified binarization scheme is described assuming the required information is available at the encoder and the decoder. Section 3.2 then describes concepts on how to derive the information, or more specifically, the value of the sign_flag and the maximum absolute level at the decoder side.

FIG. 1 illustrates an apparatus 10 for decoding NN parameters from a data stream 14, e.g. referred to as decoder 10, according to an embodiment. The decoder 10 comprises a mapping module 40, which maps quantization indices 32, using which the NN parameters are coded into the data stream 14, onto reconstruction levels 42 of the NN parameters. The reconstruction levels 42 may be dequantized so as to obtain the NN parameters (e.g. using a scalar quantizer, which may optionally be characterized by a quantization parameter, which may be signaled in the data stream, e.g. a scalar quantizer as described in section 2.1.1), however, this is not necessarily the case, but, in other examples, the mapping 40 may directly map the quantization indices onto values of the NN parameters. The mapping module 40 uses a mapping scheme 44, obtained by decoder 10 from the data stream 14, for mapping the quantization indices onto the reconstruction levels.

According to an embodiment, the decoder 10 is configured for dequantizing or scaling, e.g. using a quantization step size, e.g. a quantization parameter, the reconstruction level 42 so as to obtain a reconstructed value of the NN parameter, e.g., which may correspond to a value of the NN parameter encoded by the encoder 11 despite a quantization loss. For example, the quantization indices and the reconstruction levels may be integer numbers, so that the mapping scheme is a mapping from integer to integer numbers.

The decoder 10 comprises a mapping scheme analyzer 34, which checks whether the mapping scheme 44 fulfills the predetermined criterion. Decoder 10 further comprises a decoding module 30, configured for deriving a quantization index 32 on the basis of one or more syntax elements, which may comprise a predetermined syntax element 22. Depending on whether the mapping scheme 44 fulfills the predetermined criterion, decoding module 30 derives the predetermined syntax element 22 from the data stream 14, or infers the state of the predetermined syntax element 22. To this end, the decoding module 30 may comprise an inferring module 24 for providing the state of the predetermined syntax element 22. For example, decoder 10 may assume the state to be a predetermined one, if the mapping scheme 44 fulfills the predetermined criterion, i.e. the inferring module 24 may provide a fixed state for that case. In other examples, if the mapping scheme 44 fulfills the predetermined criterion, the state of the predetermined syntax element 22 may be determined using further information, e.g. an already decoded syntax element, or a property of the mapping scheme 44 (e.g. in case of the below described sign flag, whether all indices of the codebook are non-positive or non-negative). Deriving the predetermined syntax element 22 from the data stream 14 may, for example, be performed by the decoding module 30 by means of entropy decoding, e.g. context adaptive binary arithmetic coding, CABAC.

Figure 2:
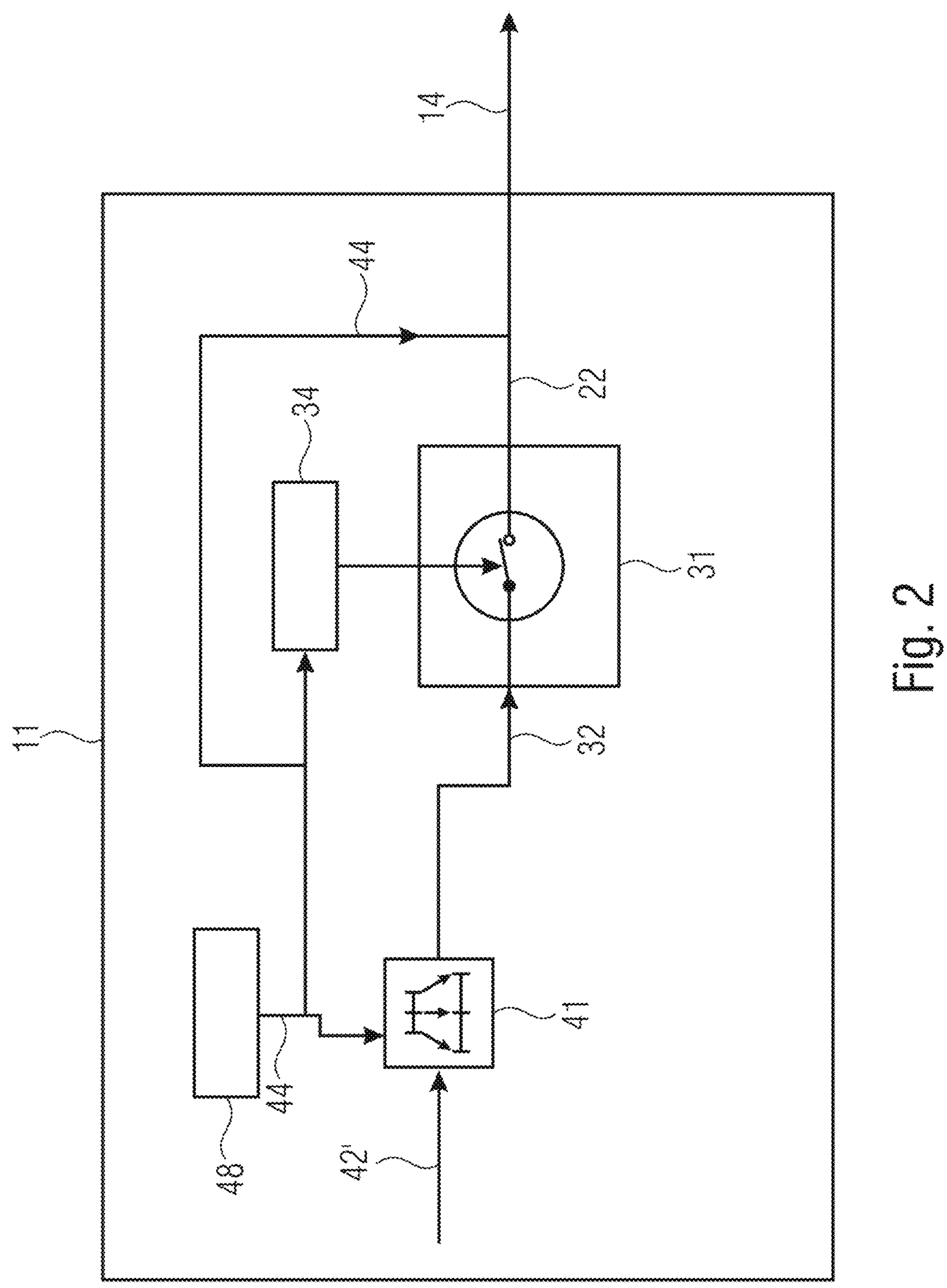
FIG. 2 shows an embodiment of an apparatus for encoding NN parameters dependent on a mapping scheme.

FIG. 2 illustrates an encoder 11 according to an embodiment, which may be a corresponding encoder to decoder 10, i.e. an encoder for encoding the data stream 14 of FIG. 1. To this end, encoder 11 may perform the inverse operation of decoder 10. Encoder 10 comprises a mapping module 41 for subjecting a reconstruction level to the mapping scheme 44 so as to obtain a quantization index 32. Mapping module 41 may apply the mapping scheme 44 in inverse direction as mapping module 40 of FIG. 1. The encoder 10 further comprises a coding module 31 for encoding the quantization index 32 into the data stream, e.g. by using one or more syntax elements comprising a predetermined syntax element 22, as described with respect to FIG. 1. If the mapping scheme 44 fulfills a predetermined criterion, coding module 31 skips, or suppresses, or refrains from, an encoding of the predetermined syntax element 22 into the data stream 14. For example, encoder 10 may comprise the mapping scheme analyzer 34 for checking the predetermined criterion on the mapping scheme 44. Encoder 10 may further comprise a mapping scheme obtainer 48 for obtaining the mapping scheme 44. For example, the mapping scheme obtainer 48 may obtain the mapping scheme 44 on the basis of the entirety of reconstruction levels, e.g. a range of values, within which the reconstruction levels are, and/or a number of reconstruction levels, and/or or step size of the reconstruction levels. The encoder 11 may be configured for quantizing or scaling, e.g. using a quantization step size, e.g. a quantization parameter, the NN parameter so as to obtain the reconstruction level of the NN parameter.

Examples of a mapping schemes 44 usable by the decoder 10 of FIG. 1 and the encoder 11 of FIG. 2 are shown in FIGS. 3 to 7.

Figure 3:
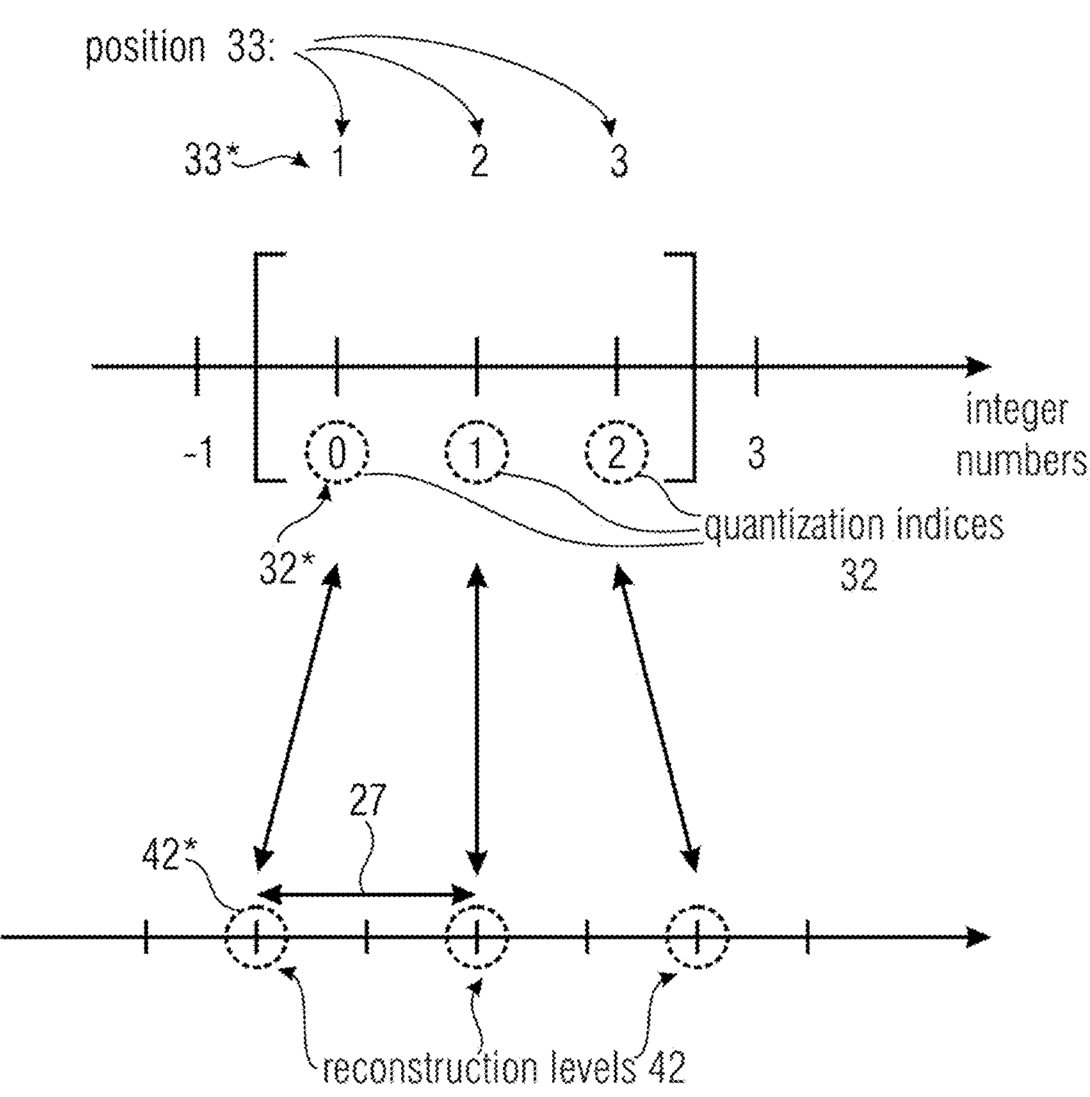
FIG. 3 shows an embodiment of a mapping scheme comprising three positive quantization indices.

FIG. 3 illustrates a mapping scheme 44 according to an embodiment, including an exemplary number or three quantization indices 32. In other words, the size of the mapping scheme 44, or the codebook, is three. Each quantization index 32 is associated with a corresponding reconstruction level 42. It is noted, that the mapping between quantization indices 32 and reconstruction levels 42 is bijective. For example, each of the quantization indices 32 has a position 33 within the sequence of quantization indices 32. The position 33 may be indicated by a position index, e.g. indices 1, 2 and 3 in FIG. 3, however, the numeration alternatively starts with index 0. According to this embodiment, the quantization indices 32 form a monotonic sequence of integer numbers, e.g., the values of the quantization indices are monotonic with respect to their position in the sequence.

According to an embodiment, the mapping scheme 44 may be signaled in the data stream 14, or characterized, by indicating the size of the sequence, and the position 33* of a predetermined quantization index 32*, e.g. the quantization index having the value zero as illustrated in FIG. 3 or any other predetermined value. The size of the sequence may be indicated by codebook_size in the following. For example, the size of the sequence may represent a number or count of the quantization indices included in the sequence, e.g., three as shown in FIG. 3. The position 33* may be indicated by the syntax element codebook_centre_offset, or by a variable cbZeroOffset in the following.

According to an embodiment, the mapping scheme 44 may further be signaled by indicating the value of a reconstruction level 42* which is associated with the predetermined quantization index 32*, and, in examples, a distance 27 between neighboring reconstruction levels. The reconstruction level 42* may represent a predetermined reconstruction level and may be indicated by codebook_zero_value in the following. To this end, also the reconstruction levels 42 may form a monotonic sequence of numbers, which may optionally also be integers.

For example, the mapping scheme 44 may be in accordance with the one described in section 2.1.2, and the mapping scheme 44 may be encoded into the data stream 14 as described in section 2.1.2.

3.1 Modified Binarization Scheme

The subsections 3.1.1 and 3.1.2 describe two modifications of the binarization scheme, based on the available information. Both methods can be used in combination, whenever the requirements for each method are fulfilled. Section 3.1.3 describes a special case, where no bins need to be transmitted.

3.1.1 Skipping of the sign_flag

The sign_flag may represent the predetermined syntax element 22 described with regard to FIG. 1 and FIG. 2. The sign_flag may be a syntax element indicating whether a value, e.g. a quantization value, or an index, e.g., a quantization index 32, is positive or negative. Optionally, the sign_flag may indicate for a plurality of values or indices whether they are all positive or negative. In other words, the predetermined syntax element 22 can be a sign flag which indicates whether the quantization index 32 has a non-negative value, i.e. a positive value, or whether the quantization index 32 has a non-positive value, i.e. a negative value.

Whenever the indices in a set of indices to be encoded are all non-negative, or all non-positive, each index, e.g., the quantization index 32, can be encoded in the following way. In the first step, a binary syntax element sig_flag is derived for the index 32, which specifies whether the corresponding index 32 is equal to zero. Then different from the scheme described in 2.1.3.1, if the sig_flag is equal to one the encoding of a sign_flag is skipped and instead a unary sequence of bins is encoded, followed by a fixed length sequence as follows:

A variable k is initialized with a non-negative integer and X is initialized with 1<<k.

One or more syntax elements abs_level_greater_X are encoded, which indicate, that the absolute value of the index is greater than X. If abs_level_greater_X is equal to 1, the variable k is updated (for example, increased by 1), then 1<<k is added to X and a further abs_level_greater_X is encoded. This procedure is continued until an abs_level_greater_X is equal to 0. Afterwards, a fixed length code of length k suffices to complete the encoding of the index 32. For example, a variable rem=X−|q| could be encoded using k bits. Or alternatively, a variable rem' could be defined as rem'=(1<<k)−rem−1 which is encoded using k bits. Any other mapping of the variable rem to a fixed length code of k bits may alternatively be used.

3.1.2 Termination of Absolute Level Coding

According to an embodiment, the predetermined syntax element 22 is a predetermined threshold flag, e.g., abs_level_greater_X, which indicates, whether or not an absolute value of the quantization index is greater than a threshold value, i.e. X, associated with the predetermined threshold flag. The threshold value may be an integer value, like 1, 2 or 3.

The absolute level of an index 32, e.g., is encoded using a unary sequence of bins (abs_level_greater_X; e.g., a sequence of threshold flags associated with different thresholds, i.e. X, wherein within this sequence the threshold may be a monotonic increasing integer number, e.g., a sequence of abs_level_greater_1, abs_level_greater_2 and abs_level_greater_3). From a decoder 10 point of view, this unary sequence is terminated if an abs_level_greater_X decoded from the bitstream, i.e. the data stream 14, equals 0. However, if the maximum absolute value is available at the encoder 11 and the decoder 10, this enables an earlier termination of the unary sequence for all indices 32 that have an absolute value equal to the maximum absolute value. Then, the binarization scheme for an index 32 to be encoded is as follows:

If the requirements of the method described in 3.1.1 are not fulfilled, then in the first step, a binary syntax element sig_flag is derived for the index 32, which specifies whether the corresponding index 32 is equal to zero. If the sig_flag is equal to one, a further binary syntax element sign_flag is derived. The bin indicates if the current index 32 is positive (e.g., bin=0) or negative (e.g., bin=1). Otherwise, if the requirements of the method described in 3.1.1 are fulfilled, the sig_flag is encoded and encoding of the sign_flag is skipped. In this case the sign_flag may represent the predetermined syntax element 22 and a threshold flag may represent a further predetermined syntax element, wherein the decoder 10 and/or the encoder 11 may be configured for checking whether the respective mapping scheme 44 fulfills a further predetermined criterion. Dependent on this check the decoder 10 may be configured to decide between inferring and decoding the further predetermined syntax element and the encoder 11 may be configured to decide between skipping encoding and encoding the further predetermined syntax element.

Next, assuming the maximum absolute value M is available, the following applies:

If M is equal to 1 no further bins are encoded, otherwise a unary sequence of bins is encoded, and if required, followed by a fixed length sequence as follows:

A variable k is initialized with a non-negative integer and X is initialized with 1<<k.

One or more syntax elements abs_level_greater_X are encoded, which indicate, that the absolute value of the index 32 is greater than X. If abs_level_greater_X is equal to 1, the variable k is updated (for example, increased by 1), then 1<<k is added to X and a further abs_level_greater_X is encoded. This procedure is continued until an abs_level_greater_X is equal to 0 or X is greater or equal to M−1. For example, the case X greater than M−1 may occur for X==0, in particular in examples, in which the sig_flag is treated as a flag indicating, whether the absolute value of q is greater than zero.

Then after an abs_level_greater_X equal to 0 is encoded, a fixed length code of length k suffices to complete the encoding of the index 32. For example, a variable rem=X−|q| could be encoded using k bits. Or alternatively, a variable rem' could be defined as rem'=(1<<k)−rem−1 which is encoded using k bits. Any other mapping of the variable rem to a fixed length code of k bits may alternatively be used.

3.1.3 Skipping of Index Encoding

In a special case, none of the syntax elements need to be transmitted and the integer index 32, and thus the reconstruction level can be completely derived at the decoder side. This is given, when the maximum absolute level of all indices to be transmitted is zero (M=0), which means that all indices to be transmitted in the tensor are zero.

3.2 Derivation Concepts for sign_flag and Maximum Absolute Level

The methods described in section 3.1 require the value of the sign_flag or the maximum absolute value to be available at the encoder 11 and decoder 10 side. Usually, this information is only available at the encoder 11 side, but this section provides concepts on how to derive the information at the decoder 10.

3.2.1 Derivation of sign_flag Value and Threshold Flag (a abs_level_greater_X Syntax Element) from a Codebook If a codebook-based integer representation, e.g, according to section 2.1.2, is applied, the maximum absolute level and, in some cases, the value of the sign flag can be derived at the decoder 10. Usually, the codebook is decoded from the bitstream 14 in a previous step. In some cases, limits of a range comprising all possible quantization indices may be determined from the codebook.

For the example of a codebook according to section 2.1.2, which may be decoded from the bitstream 14, the indices to be decoded depend on the length of the codebook (codebook_size) and the value of cbZeroOffset. The codebook may be mapping scheme 44 as shown in one of FIG. 3 to 7 and may be selected by the decoder 10, shown in FIG. 1, and the encoder 11, shown in FIG. 2.

a) Derivation of Threshold Flap:

The threshold flag is an example for the predetermined syntax element 22 or a further predetermined syntax element. The threshold flag, for example, indicates, whether or not an absolute value of the quantization index 32 is greater than a threshold value associated with the threshold flag. For example, the threshold value is a positive value.

As described section 3.1.2, a parameter M may be used to terminate the encoding/decoding of the sequence of threshold flags, M representing the maximum absolute value of a current index 32.

According to an embodiment, if codebook_size is equal to one, the maximum absolute level M is derived to be zero (case described in section 3.1.3). In this case, the decoder 10 may be configured to infer that the quantization index is zero.

Otherwise (codebook_size is not equal to one), for a current index 32 to be encoded the value of the sign_flag is derived or decoded from the bitstream 14. Then, the maximum absolute value M of a current index 32 can be derived as follows:

$$M = \begin{cases} cbZeroOffset, & \text{if sign\_flag} = 1 \\ \text{codebook\_size} - cbZeroOffset - 1, & \text{if sign\_flag} = 0 \end{cases}$$

This implementation has the advantage, that M may, in examples, indicate the maximum possible value M exactly for both positive and negative quantization indices, also in cases in which the quantization indices are not symmetrically distributed around zero.

For example, there can be two cases for which the predetermined criterion is fulfilled and a predetermined threshold flag can be inferred by the decoder 10 or omitted at an encoding by the encoder 11. The predetermined criterion, for example, is fulfilled, if the quantization index 32 to be reconstructed or encoded has a non-negative value and if none of the quantization indices 32 included in the mapping scheme 44 is greater than the threshold value which is associated with the predetermined threshold flag. The predetermined criterion, for example, is also fulfilled, if the quantization index 32 to be reconstructed or encoded has a non-positive value and if none of the quantization indices 32 included in the mapping scheme 44 is smaller than the negative of the threshold value which is associated with the predetermined threshold flag. For example, decoder 10/encoder 11 may check the predetermined criterion in dependence on the sign of the quantization index 32. For example, decoder 10/encoder 11 may determine the predetermined threshold flag individually for the two cases of positive and negative quantization indices 32.

For example, the decoder 10/encoder 11 of FIG. 1 and FIG. 2 may check, for one or more threshold flags, e.g. sequentially check a sequence of threshold flags, whether the predetermined criterion is fulfilled. The decoder 10/encoder 11 may select the threshold flag, which is associated with the smallest absolute threshold value, and which fulfills the predetermined criterion, as the predetermined threshold flag, e.g., the threshold flag abs_level_greater_M. The decoder 10/encoder 11 may select the threshold flag, whose threshold value is associated with the highest absolute value possible for a quantization index 32 according to the mapping scheme 44, as the predetermined threshold flag, e.g., the threshold flag abs_level_greater_M. In other words, the decoder 10/encoder 11 may be configured for determining a maximum value M out of absolute values of quantization indices 32 included in the mapping scheme 44, and selecting the predetermined threshold flag out of one or more threshold flags so that a threshold value associated with the predetermined threshold flag is equal to the maximum value M out of the absolute values of the quantization indices 32. The maximum value M out of the absolute values of the quantization indices 32 may be determined on the basis of an indication of a number, e.g. a count, of the quantization indices 32 included in the mapping scheme 44.

If the predetermined syntax element 22 is a predetermined threshold flag, the decoder 10 may be configured for inferring that the predetermined threshold flag indicates that the absolute value of the quantization index 32 is not greater than the threshold value associated with the predetermined threshold flag and the encoder 11 may be configured for skipping an encoding of the predetermined threshold flag into the data stream 14. At the inference the decoder 10 may be configured for setting the predetermined syntax element 22 to a predetermined state indicating that the quantization index 32 is not greater than the threshold value. Based on this inference the decoder 10, for example, may be configured to set the value of the quantization index 32 to the threshold value associated with the predetermined threshold flag or may be configured to further decode a residual value of the quantization index, e.g. a difference between the quantization index 32 and the threshold value associated with the predetermined threshold flag, from the data stream 14.

The quantization index 32 may be represented by two or more threshold flags, which can be decoded/encoded sequentially by deriving/encoding a first one of the two or more threshold flags, and if the first threshold flag indicates that the value of the absolute value of the quantization index 32 is greater than a threshold value associated with the first threshold flag, e.g., adapting the value of the quantization index based on the threshold value associated with the first threshold flag, and continuing the sequential reading/encoding of the threshold flags, and if the first threshold flag indicates that the value of the absolute value of the quantization index is not greater than the threshold value associated with the first threshold flag, stopping the sequential deriving/encoding of the threshold flags, and, e.g., adapting the value of the quantization index based on the first threshold value associated with the first threshold flag and optionally continuing with decoding/encoding a residual value of the quantization index 32 from/into the data stream and adapting the value of the quantization index 32 based on the first threshold value and the residual value. The sequence of decoding/encoding threshold flags of the two or more threshold flags, for example ends, if the respective threshold flag corresponds to the predetermined threshold flag, or if the respective threshold flag indicates that the value of the absolute value of the quantization index is not greater than the threshold value associated with the respective threshold flag. In case of the respective threshold flag corresponding to the predetermined threshold flag and if the mapping scheme 44 fulfills the predetermined criterion, the encoder 11, for example, is configured for refraining from encoding the predetermined threshold flag into the data stream 14, and skipping an encoding of the threshold flags and, e.g., continuing with encoding a residual value of the quantization index into the data stream 14. In case of the respective threshold flag corresponding to the predetermined threshold flag and if the mapping scheme 44 fulfills the predetermined criterion, the decoder 10, for example, is configured for ending the sequence of deriving the two or more threshold flags by inferring the state of the predetermined threshold flag and optionally, the decoder 11, for example, is configured for continuing with decoding a residual value of the quantization index 32 from the data stream 14. For example, the two or more threshold flags form a sequence of threshold flags, each being associated with a respective threshold value, the threshold flags being monotonically arranged in the sequence with respect to their associated threshold values, e.g. the threshold values are positive integer numbers. The residual value, for example, is represented in the binary representation with a fixed number of bins.

According to an embodiment, the decoder 10 may be configured for, if the quantization index 32 is not zero, deriving a sign flag for the quantization index 32 and sequentially deriving one or more threshold flags, e.g., including the predetermined threshold flag, for the quantization index 32. The sequentially deriving may be performed by deriving a first one of the threshold flags, and if the first threshold flag indicates that the value of the absolute value of the quantization index is greater than a threshold value associated with the first threshold flag, (e.g., adapting the value of the quantization index based on the threshold value associated with the first threshold flag, and) continuing the sequential reading of the threshold flags, and if the first threshold flag indicates that the value of the absolute value of the quantization index is not greater than the threshold value associated with the first threshold flag, stopping the sequential deriving of the threshold flags, (and, e.g., adapting the value of the quantization index based on the first threshold value associated with the first threshold flag). The apparatus is configured for performing the continuing of the sequential deriving of the threshold flags by deriving a subsequent one of the threshold flags, and if the subsequent threshold flag indicates that the value of the absolute value of the quantization index is greater than a threshold value associated with the subsequent threshold flag, (e.g., adapting the value of the quantization index based on the threshold value of the current threshold flag, and) continuing the sequential deriving of the threshold flags, and if the subsequent threshold flag indicates that the value of the absolute value of the quantization index is not greater than the threshold value associated with the subsequent threshold flag, stopping the sequential deriving of the threshold flags (and, e.g., adapting the value of the quantization index based on the first threshold value associated with the first threshold flag).

According to an embodiment, the encoder 11 may be configured for, if the value of the quantization index is not zero, if a first threshold flag out of one or more threshold flags (e.g. the one or more threshold flags form a sequence of threshold flags, each being associated with a respective threshold value, the threshold flags being monotonically arranged in the sequence with respect to their associated threshold values, e.g. the threshold values are positive integer numbers) is the predetermined threshold flag, refraining from encoding the first threshold flag into the data stream, and skipping an encoding of the threshold flags (and, e.g., continuing with encoding a residual value of the quantization index (e.g. a difference between the quantization index and the threshold value associated with the predetermined threshold flag) into the data stream), and if the first threshold flag is not the predetermined threshold flag, encoding the first threshold flag into the data stream, and

- if the absolute value of the quantization index is greater than a threshold value associated with the first threshold flag, continuing with encoding a subsequent threshold flag of the one or more threshold flags, and
- if the absolute value of the quantization index is not greater than the threshold value associated with the first threshold flag, skipping an encoding of the threshold flags (and, e.g., continuing with encoding the residual value), and wherein the apparatus is configured for performing the encoding of the subsequent threshold flags by

- if the subsequent threshold flag is the predetermined threshold flag, refraining from encoding the subsequent threshold flag into the data stream, and stopping an encoding of the threshold flags (and, e.g., continuing with encoding the residual value into the data stream),
- if the subsequent threshold flag is not the predetermined threshold flag, encoding the subsequent threshold flag into the data stream, and
  - if the absolute value of the quantization index is greater than a threshold value associated with the subsequent threshold flag, continuing with encoding an even subsequent threshold flag of the one or more threshold flags, and
  - if the absolute value of the quantization index is not greater than the threshold value associated with the subsequent threshold flag stopping an encoding of the threshold flags (and, e.g., continuing with encoding the residual value into the data stream).

The approach discussed here under item a) also applies for the approach discussed below under item c), wherein the term “predetermined syntax element” is then to be understood as “further predetermined syntax element” and the term “predetermined criterion” is then to be understood as “further predetermined criterion”.

b) Derivation of Sign Flag

The sign flag is an example for the predetermined syntax element 22 or a further predetermined syntax element. The sign flag, for example, indicates whether a quantization index 32 is positive or negative.

In two cases the sign_flag can be derived at the decoder 10 as follows, e.g., on the basis of an indication of a position 33* within the sequence of integer numbers, at which position 33* a quantization index 32* having the value zero is located.

Whenever cbZeroOffset is equal to 0, all indices to be decoded are either zero or positive. In this case the sign_flag is inferred to be 0.

Whenever cbZeroOffset is equal to codebook_size−1, all indices to be decoded are either zero or negative. In this cases the sign_flag is inferred to be 1.

Referring to FIG. 2, the encoder 11 may be configured to decide on encoding the sign flag or not, also on the basis of the position 33*. Additionally, the encoder 11, for example, is configured to encode cbZeroOffset, i.e. an indication of the position 33*, into the data stream 14.

Referring to FIG. 1, the decoder 10 may first check whether the quantization index 32 has a value of zero or not, e.g., by deriving a significance flag, e.g., decoding the significance flag from the data stream 14 or inferring the significance flag. For example, only if the quantization index 32 is not zero, the predetermined criterion is checked and the decoder 10 decides on whether the sign flag is to be inferred or decoded from the data stream 14. After inferring or decoding the sign flag the decoder 10 may be configured for continuing the derivation of the quantization index 32 with deriving one or more threshold flags, each of which indicates whether an absolute value of the quantization index is greater than a threshold value associated with the threshold flag. If the significance flag indicates that the value of the quantization index is zero, the decoder 10 may be configured for setting the value of the quantization index to zero Referring to FIG. 2, the encoder 11 may also be configured for checking whether the quantization index 32 has a value of zero or not and only if the quantization index 32 is not zero, the predetermined criterion is checked and the encoder 11 decides on whether the sign flag is to be encoded into the data stream 14 or not. After this decision, the encoder 11 may be configured for continuing the encoding of the quantization index 32 with encoding one or more threshold flags, each of which indicates whether an absolute value of the quantization index 32 is greater than a threshold value associated with the threshold flag.

c) Derivation of Threshold Flap and Sign Flag

Referring to FIG. 1 and FIG. 2, the decoder 10/encoder 11 are further configured for checking whether the mapping scheme 44 fulfills a further predetermined criterion. If the mapping scheme 44 fulfills the further predetermined criterion, the decoder 10 may be configured for inferring that a further predetermined syntax element has a predetermined state, e.g., which indicates that the quantization index 32 is not greater than the threshold value, and the encoder 11 may be configured for skipping an encoding of the further predetermined syntax element into the data stream 14, e.g., so that the further predetermined syntax element is to be inferred by the decoder 10. The further predetermined syntax element, for example, is part of the representation of the quantization index 32, e.g. two or more syntax elements may represent the quantization index 32. If the mapping scheme 44 does not fulfill the further predetermined criterion, the decoder 10 may be configured for deriving or reading the further predetermined syntax element from the data stream 10 and the encoder 11 may be configured for encoding the further predetermined syntax element into the data stream 14. The predetermined syntax element 22, for example, is the sign flag and the further predetermined syntax element, for example, is a predetermined threshold flag. The predetermined criterion to be checked in connection with the predetermined syntax element 22, is described under item b above and the further predetermined criterion to be checked in connection with the further predetermined syntax element 22, is described under item a above.

3.3 Preferred Embodiments

In an advantageous embodiment a codebook according to section 2.1.2 is decoded from the bitstream, where codebook_size is equal to 1 and cbZeroOffset is equal to 0. Then the derivation process of section 3.2.1 for the sign_flag (inferred to 0) and for the maximum absolute level M (derived to 0) is applied. Then the encoding process according to section 3.1.3 skipping the whole index encoding is used. Referring to the decoder 10 of FIG. 1 and the encoder 11 of FIG. 2, in this embodiment, the predetermined criterion is fulfilled, if the mapping scheme 44 comprises exactly one quantization index 32, which has the value zero, and the predetermined syntax element 22 is a significance flag, which indicates, whether or not the quantization index has the value zero. The decoder 10 is configured for inferring that the quantization index 32 is zero, if the mapping scheme 44 fulfills the predetermined criterion and the encoder 11 is configured for refraining from encoding a, e.g. any, syntax element into the data stream 14, which syntax element is dedicated for signaling the quantization index 32. In this case, at least the predetermined syntax element 22, i.e. the significance flag, is not encoded by the encoder 11, if the predetermined criterion is fulfilled. The decoder 10 may be configured for deriving the quantization index 32 independent of a syntax element of the data stream 14, which syntax element is dedicated for signaling the quantization index 32, e.g., deriving the quantization index without decoding such a dedicated syntax element from the data stream.

Figure 4:
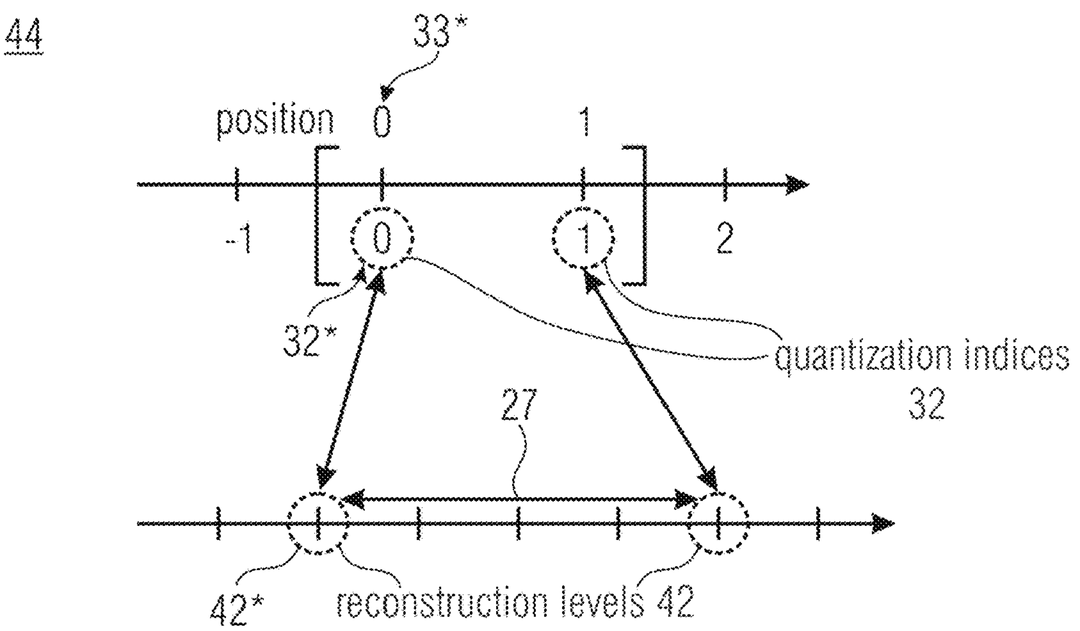
FIG. 4 shows an embodiment of a mapping scheme comprising two positive quantization indices.

In an advantageous embodiment, shown in FIG. 4, a codebook, i.e. mapping scheme 44, according to section 2.1.2 is decoded/encoded from/into the bitstream 14, where codebook_size is equal to 2 and cbZeroOffset is equal to 0. In other words, a size of a monotonic sequence of integer numbers of the mapping scheme 44 is 2, and a quantization index 32* having the value zero has the first position 33* within the sequence of quantization indices 32. Then the derivation process of section 3.2.1 for the sign_flag (inferred to 0) and for the maximum absolute level M (derived to 1) is applied. Then the encoding process according to section 3.1.2 including the sign_flag skipping is used.

Figure 5:
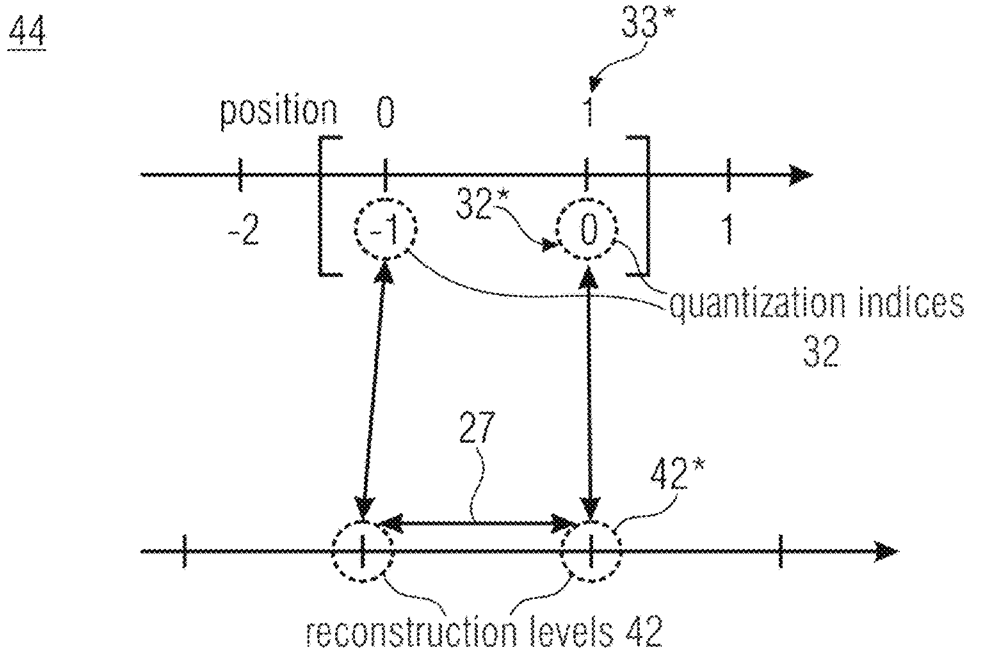
FIG. 5 shows an embodiment of a mapping scheme comprising a negative quantization indices.

In another advantageous embodiment, shown in FIG. 5, a codebook, i.e. mapping scheme 44, according to section 2.1.2 is decoded/encoded from/into the bitstream 14, where codebook_size is equal to 2 and cbZeroOffset is equal to 1. In other words, a size of a monotonic sequence of integer numbers of the mapping scheme 44 is 2, and a quantization index 32* having the value zero has the second position 33* within the sequence of quantization indices 32. Then the derivation process of section 3.2.1 for the sign_flag (inferred to 1) and for the maximum absolute level M (derived to 1) is applied. Then the encoding process according to section 3.1.2 including the sign_flag skipping is used.

In a further advantageous embodiment, shown in FIG. 3, a codebook, i.e. mapping scheme 44, according to section 2.1.2 is decoded/encoded from/into the bitstream, where codebook_size is equal to 3 and cbZeroOffset is equal to 0. In other words, a size of a monotonic sequence of integer numbers of the mapping scheme 44 is 3, and a quantization index 32* having the value zero has the first position 33* within the sequence of quantization indices 32. Then the derivation process of section 3.2.1 for the sign_flag (inferred to 0) and for the maximum absolute level M (derived to 2) is applied. Then the encoding process according to section 3.1.2 including the sign_flag skipping is used.

Figure 6:
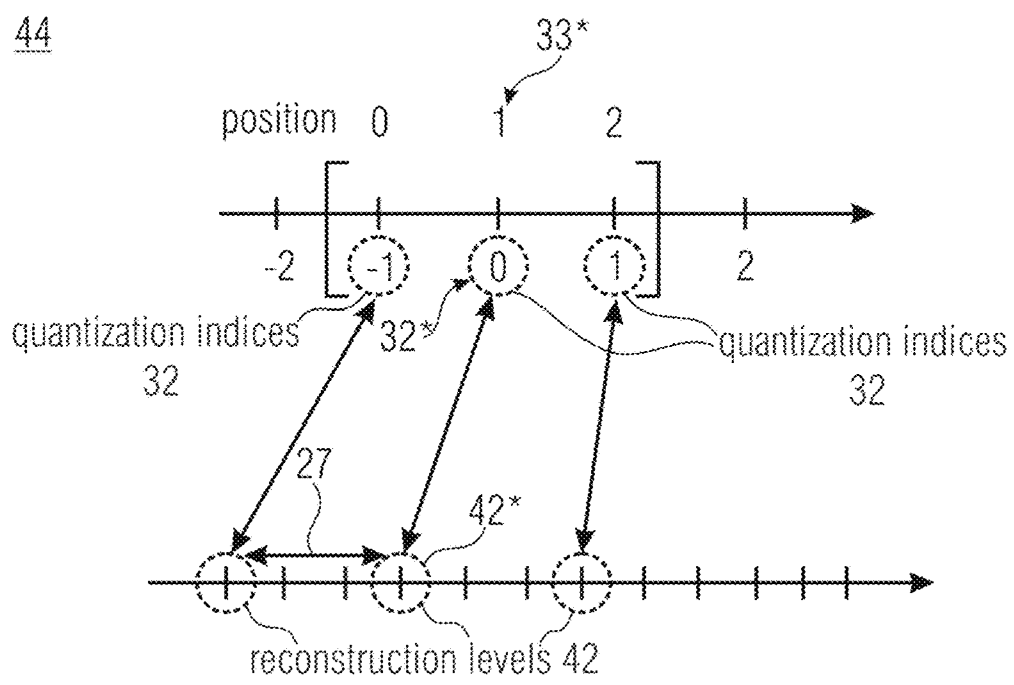
FIG. 6 shows an embodiment of a mapping scheme comprising positive and negative quantization indices.

In a further advantageous embodiment, shown in FIG. 6, a codebook, i.e. mapping scheme 44, according to section 2.1.2 is decoded/encoded from/into the bitstream 14, where codebook_size is equal to 3 and cbZeroOffset is equal to 1. In other words, a size of a monotonic sequence of integer numbers of the mapping scheme 44 is 3, and a quantization index 32* having the value zero has the second position 33* within the sequence of quantization indices 32. Then the derivation process of section 3.2.1 for the maximum absolute level M (derived to 1) is applied. Then the encoding process according to section 3.1.2 without the sign_flag skipping is used.

Figure 7:
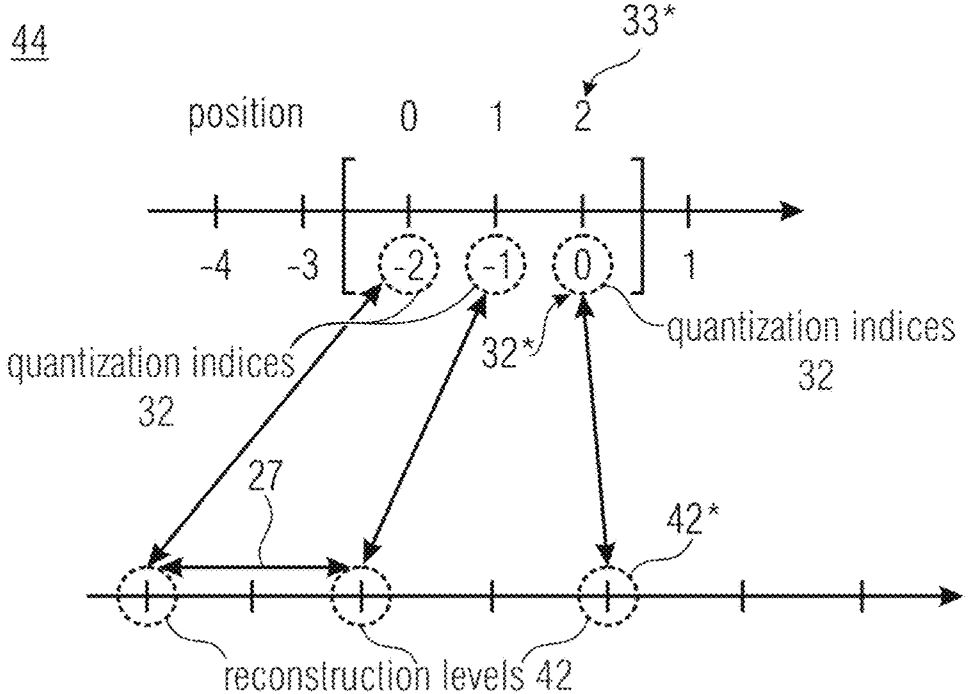
FIG. 7 shows an embodiment of a mapping scheme comprising two negative quantization indices.

In another advantageous embodiment, shown in FIG. 7, a codebook, i.e. mapping scheme 44, according to section 2.1.2 is decoded/encoded from/into the bitstream 14, where codebook_size is equal to 3 and cbZeroOffset is equal to 2. In other words, a size of a monotonic sequence of integer numbers of the mapping scheme 44 is 3, and a quantization index 32* having the value zero has the third position 33* within the sequence of quantization indices 32. Then the derivation process of section 3.2.1 for the sign_flag (inferred to 1) and for the maximum absolute level M (derived to 2) is applied. Then the encoding process according to section 3.1.2 including the sign_flag skipping is used.

The predetermined syntax element 22 might be a sign flag indicating a sign of quantization indices 32. The predetermined criterion, for example, is fulfilled, if the quantization indices 32, e.g., the set of quantization indices, included in the mapping scheme 44 do not include both positive and negative quantization indices. This, for example, applies for the mapping schemes 44 shown in FIG. 3 to 5 and FIG. 7. The predetermined criterion, for example, is not fulfilled, if the quantization indices 32 included in the mapping scheme 44 include both positive and negative quantization indices. This, for example, applies for the mapping scheme 44 shown in FIG. 6. For example, if the mapping scheme 44 of FIG. 3 or FIG. 4 is selected, the decoder 10 may be configured for inferring that the predetermined syntax element 22 is non-negative, i.e. positive. For example, if the mapping scheme 44 of FIG. 5 or FIG. 7 is selected, the decoder 10 may be configured for inferring that the predetermined syntax element 22 is non-positive, i.e. negative.

In a particularly advantageous embodiment an integer parameter/index is decoded as described in the following (using the function int_param in FIG. 8A and FIG. 8B). The scheme in FIG. 8A and FIG. 8B is a modified version of the one that is given in [2] section 10.2.1.5.

In FIG. 8A and FIG. 8B, if no codebook is used, the values of codebookSize and cbZeroOffset are set to zero.

The variable codebookSize here is equal to the value of codebook_size used above.

The variable QuantParam may correspond to the reconstructed quantization index.

In the example of FIG. 18, quantization indices are integer numbers. The variable maxNumNoRemMinus1 may indicate a length of a sequence of threshold flags which are associated with positive integer threshold values with an monotonic increment of 1, e.g. a the threshold flags of the sequence being associated with values 1, 2, 3, 4, maxNumNoRemMinus1+1. For these threshold flags, there is no residual in case of purely integer numbers, so that an encoding of the residual may be skipped.

The variable maxAbsVal may correspond to variable M described in section 2.1.2 and 3.2.1.

4 Invention Aspect 2: History Dependent Significance Coding

The invention reduces the bitrate used to code the significance flag (sig_flag) as described in 2.1.3.1 of coefficients in update layers as described in 2.2.1. Given the sig_flag of a coefficient q(x,y,k) at position (x,y) in the update layer with index k (where index k identifies the model update out of a sequence of model updates), the basic idea is to model the sig_flag's probability in dependence of the coefficients at position (x,y) that occur in the preceding update or base layers with indices l smaller than k. Note that, in contrast to the method described in 2.2.2.1, the invention regards multiple preceding coefficients, i.e. the coefficient history at (x,y).

4.1 Overview

Figure 9:
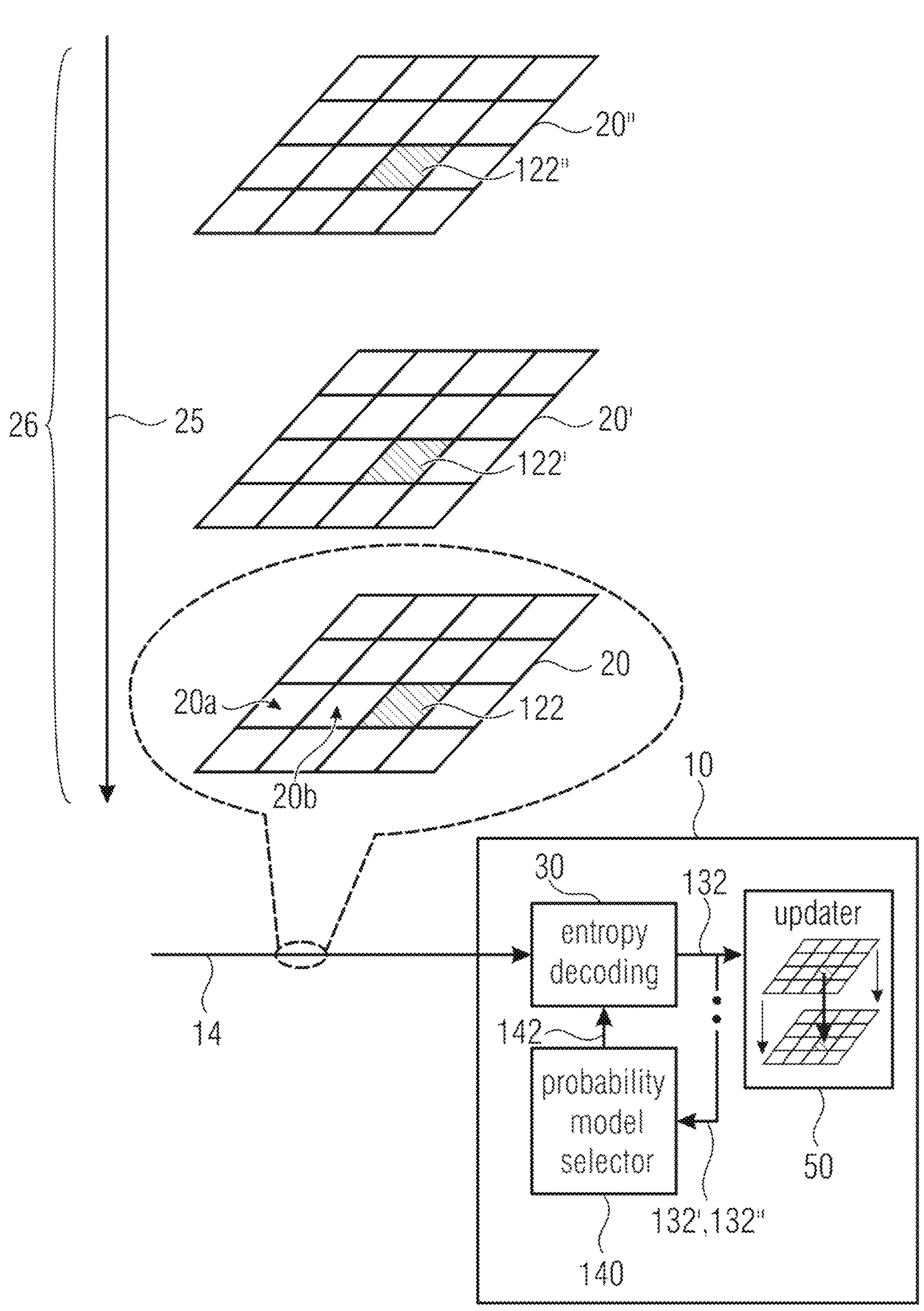
FIG. 9 shows an embodiment of an apparatus for decoding update parameters for NN parameters.

FIG. 9 illustrates an apparatus 10 for decoding NN parameters from a data stream 14, e.g. referred to as decoder 10, according to an embodiment. The NN parameters define a neural network. The decoder 10 receives a data stream 14, which comprises an encoded representation 122 of an update parameter 132 for one of the neural network parameters. For example, the data stream 14 may include a plurality 20 of update parameters, e.g. arranged in a matrix representation, each of the update parameters, e.g., providing an update information of for a corresponding NN parameter of the NN (which, e.g., is to be updated by decoder 10). The decoder 10 comprises an entropy decoding module 30, configured for decoding the encoded representation 122 so as to obtain the update parameter 132. Decoder 10 further comprises an update module 50, configured for updating the corresponding NN parameter using the update parameter 132, e.g. by summation (e.g., combining the NN parameter and the update parameter), or multiplication of the update parameter 132 with the NN parameter, or by using the update parameter 132 as input for controlling another operation for determining the updated NN parameter based on the current value of the NN parameter, or by replacing the NN parameter with the update parameter 132. In other words, the update may be incremental.

Decoder 10 further comprises a probability model selector 140, which selects a probability model 142 for the entropy decoding of the update parameter 132 in dependence on previous update parameters, see 122' and 122". For example, the update signaled in the data stream 14 may be one of a sequence 26 of updates, each update comprising a respective pluralities of update parameters, e.g. pluralities 20', 20". Each of the pluralities of update parameters may comprise a corresponding update parameter 132 for the NN parameter, to which the update parameter 132 refers. The update parameters may be signaled by means of encoded representations 122', 122".

Accordingly, probability model selector 140 may gain information on the basis of the previous update parameters 132', 132", e.g. by storing them, or by deriving a history parameter, e.g. h, and may use the information for selecting the probability model 142.

According to an embodiment, the decoder 10 may infer a property of the previous update parameters 132', 132" by analyzing the NN parameter, e.g. checking, if it is zero. According to this embodiment, the decoder may select the probability model 142 in dependence on the NN parameter, and, in examples, even independent of the previous update parameters 132', 132". For example, the decoder 10 may check the value of the NN parameter, and if the NN parameter has a certain value, e.g. zero, select a predetermined probability model, e.g. the special model. Otherwise, the decoder 10 may select a second probability model, or, may select the probability model 142 in dependence on the previous parameters.

Figure 10:
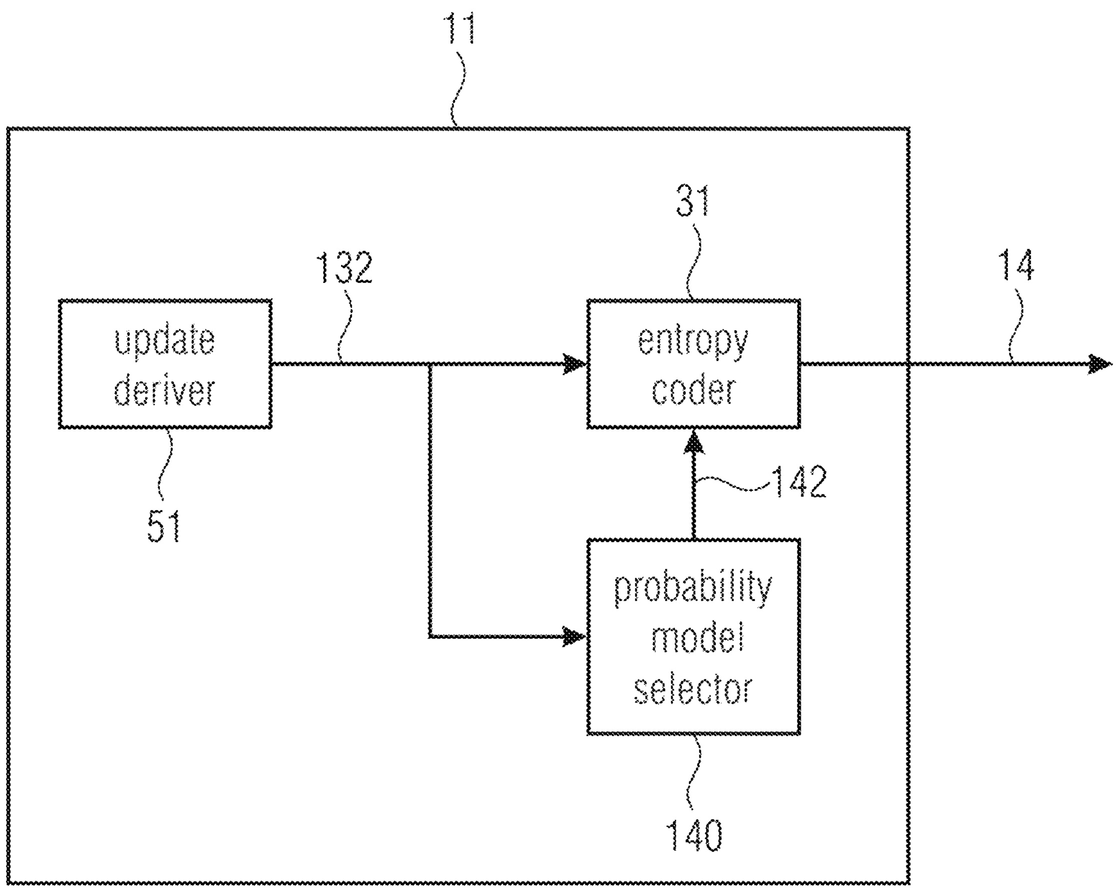
FIG. 10 shows an embodiment of an apparatus for encoding update parameters for NN parameters.

FIG. 10 illustrates a corresponding apparatus 11 for encoding, i.e. an encoder 11, the update parameters for the NN parameters according to an embodiment, the decoder 10 performing the backward operation of encoder 11. Encoder 11 comprises an update deriver 51 for deriving the update parameter 132.

According to an embodiment, the encoder 11 is configured for obtaining an update parameter set, see 20, and encoding same into the data stream 14 and the decoder 10 is configured for deriving, from the data stream 14, the update parameter set 20. The update parameter set 20 comprises, for a plurality of the NN parameters, a plurality of respective update parameters and the decoder 10 is configured for updating the NN parameters using the respective update parameters. The decoder 10/encoder 11 is configured for selecting, for each of the update parameters, a respective probability model 142 in dependence on one or more previous update parameters for the respective NN parameter, e.g., and using the selected probability model 142 for entropy decoding/encoding the respective update parameter 132.

According to an embodiment, the update parameter 132 and the one or more previous update parameters 132', 132" can be part of a sequence of update parameters for the NN parameter. The decoder 10, for example, is configured for sequentially updating the NN parameter based on the sequence of update parameters and the encoder 11, for example, obtains the update parameter 132 so that, based on the update parameter 132, an update of the NN parameter is performable by the decoder 10. For example, the update parameter 132 allows a decoder 10 to set or modify the NN parameter starting from the current value of the NN parameter. For example, the encoder 11 is configured for sequentially updating the NN parameter of the neural network based on the sequence of update parameters, e.g. so as to having available the NN as on the decoder 10 side. For example, the encoder 11 is for obtaining the update parameter 132 based on the sequentially updated neural network.

For both, the decoder 10 and the encoder 11, the probability model 142, for example, is a context model, or an adaptive model, or an adaptive context model. For example, the context for the update parameter 132 is selected based on a previously decoded, e.g. directly neighboring, update parameter (e.g., see 20*a* and 20*b*) being part of the same update parameter set (see 20) but being another parameter, e.g. relating to another combination of input/output neuron, and/or the probability is modeled in dependence of the context. Alternatively, the context for the update parameter 132 is selected based on the sequence of previous update parameters 132', 132" and/or the current NN parameter and/or the probability is modeled in dependence of the context.

Figure 11:
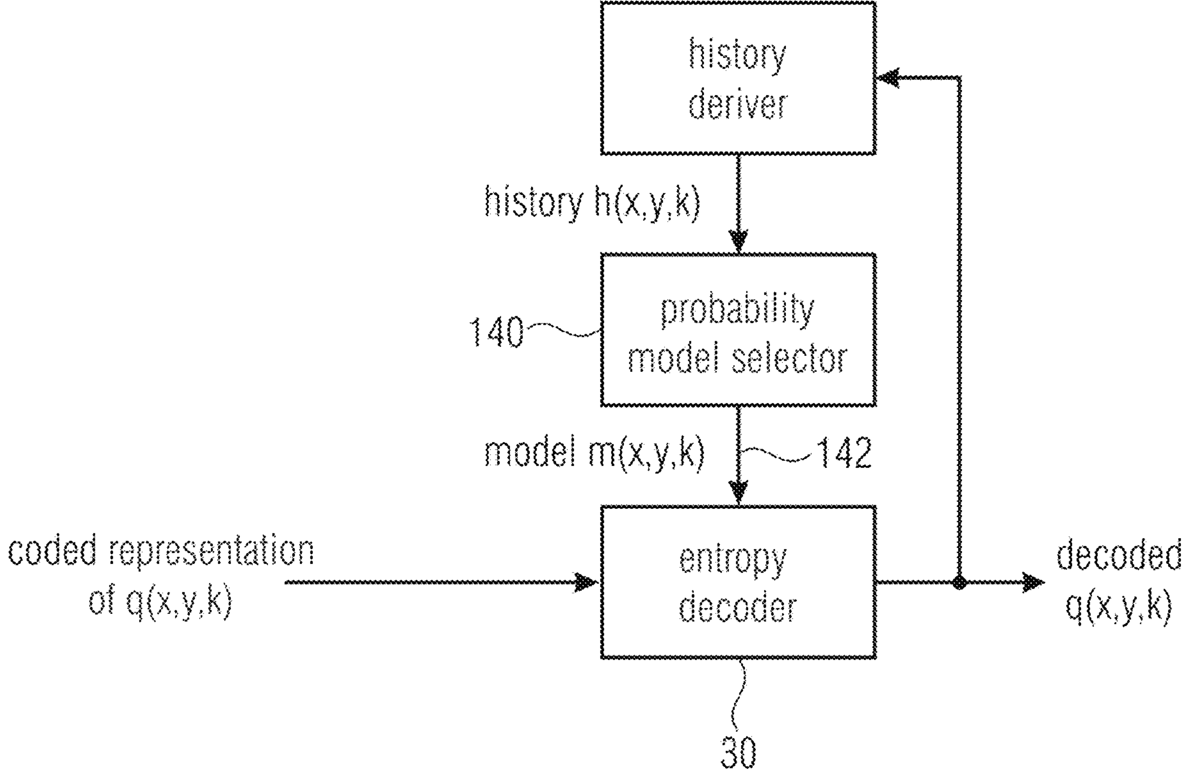
FIG. 11 shows an embodiment of a decoding of a quantization index representing an update parameter for a NN parameter.

FIG. 11 shows the invention's building blocks and data flow. Target is the decoding of the coded representation of q(x,y,k). Based on the history h(x,y,k), the probability model selector 140 selects a probability model 142 m(x,y,k). The model is then used by the entropy decoder 30 to decode the sig_flag related to q(x,y,k). After decoding also the other bins related to q(x,y,k), the entropy decoder 30 reconstructs and provides the decoded value of q(x,y,k). Then, the history deriver uses q(x,y,k) and h(x,y,k) to derive the history h(x,y,k+1) for the next update.

4.2 Decoding Process

Details of the decoding process are as follows:

1) The history h(x,y,k) indicates whether any previous coefficient q(x,y,l) with l<k is not equal to zero, i.e. whether a significant coefficient has been transmitted at position (x,y) in any update layer (or the base layer) before. To this end, in an advantageous embodiment (E1) the history deriver derives h(x,y,k) iteratively. This means by:
   - setting h(x,y,0) to zero before decoding the first layer update (i.e. the base layer)
   - setting h(x,y,k+1) equal to (h(x,y,k)||(q(x,y,k)!=0)) for further layer updates (where "||" represents a logical OR operator, and "!=" a logical "not equal to" operator)
2) If h(x,y,k) is equal to 1, the probability mode selector 140 selects a special probability model, e.g., a first probability model, otherwise (if h(x,y,k) is equal to 0) the probability mode selector 140 selects a default probability model. In an advantageous embodiment, the special probability model provides a constant probability, e.g. close to zero or zero or the minimum probability representable by the entropy decoder 30. In an advantageous embodiment, the default probability model is e.g. an adaptive context model selected by other means e.g. as described in 2.1.3.2.

Referring to FIG. 9 and FIG. 10, the decoder 10/encoder 11, for example, is configured for selecting a first probability model (e.g. a special model, e.g. a constant model representing a constant probability close to zero or zero, or the minimum probability representable by the entropy decoder 30/encoder 31) for the entropy decoding/encoding of the update parameter 132, if the sequence of previous update parameters 132', 132" does not fulfill a predetermined criterion, e.g., if not all of the previous update parameters of the sequence have a predetermined value, e.g., if not all of the previous update parameters indicate that the NN parameter is to be kept unchanged. The predetermined criterion, for example, is fulfilled, if all of the previous update parameters 132', 132" of the sequence have a predetermined value, e.g., zero, e.g., if all of the one or more previous update parameters indicate that the NN parameter is to be kept unchanged.

The decoder 10/encoder 11, for example, is configured for selecting the probability model 142 for the entropy decoding 30/encoding 31 of the update parameter 132 in dependence on history data, which, e.g., is derived by the decoder 10/encoder 11 in dependence on the previous update parameters 132', 132". The decoder 10/encoder 11, for example, is configured for entropy decoding 30/encoding 31 the update parameter 132 using the probability model 142, and updating the history data in dependence on the decoded update parameter 132.

The decoder 10/encoder 11, for example, is configured for updating history data in dependence on the previous update parameter. Updating history data, e.g., can be performed by setting a history parameter, e.g. the history deriver h; or storing the (previous) update parameter, e.g., see section 4.3.3. Optionally, the history data is updated further in dependence on the history data (e.g., current and/or previous history data), e.g. the decoder 10/encoder 11 may determine a value of a parameter comprised in the history data in dependence on the previous update parameter (see 132', 132") and in dependence on a value of the parameter before updating the parameter (e.g., the value of the current NN parameter), and subsequently replace the value of the parameter with the determined value.

According to an embodiment, the decoder 10/encoder 11, for example, is configured for selecting a first probability model, e.g. a special model, "zero model", for the entropy decoding/encoding of the update parameter 132, if the sequence of previous update parameters 132', 132" does not fulfill a predetermined criterion, e.g. if not all previous update parameters 132', 132" are equal to zero. Further the decoder 10/encoder 11, for example, is configured for updating a history parameter, which indicates whether or not the sequence of previous update parameters 132', 132" fulfills the predetermined criterion, e.g. setting a history parameter, e.g. the history deriver h, in dependence on the update parameter 132 by

- if the history parameter has a first value, e.g. one, which indicates that the predetermined criterion is not fulfilled, or if the update parameter 132 does not have a predetermined value, e.g. is not equal to zero, setting the history parameter to the first value, if the update parameter 132 has the predetermined value, e.g. zero, and the history parameter has a second value, e.g. zero, which indicates that the predetermined criterion is fulfilled, setting the history parameter to the second value.

Thus, the current update parameter 132 is used to update the history data, so that an optimized possibility model 142 can be selected based on the updated history data for a subsequent update parameter of the respective NN parameter.

For example, the decoder 10/encoder 11 is configured for selecting the first probability model for an entropy decoding/encoding of a subsequent update parameter of the NN parameter, e.g., in a sequence of update parameters, if the history parameter has the first, e.g. one, value, e.g., after updating the history parameter based on the update parameter 132. Optionally, the decoder 10/encoder 11 is further configured for selecting a second probability model, e.g. a default model, e.g. an adaptive model, for the entropy decoding of the subsequent update parameter of the NN parameter, e.g., in a sequence of update parameters, if the history parameter has the second, e.g. zero, value.

According to an embodiment, the decoder 10/encoder 11 is configured for checking if one of the previous update parameters 132', 132" has the predetermined value, e.g., zero, by considering a significance flag for the previous update parameter. If one of the previous update parameters 132', 132" has not the predetermined value, the sequence of previous update parameters 132', 132" does not fulfill a predetermined criterion. This check gives a good indication for the update parameter 132 being zero or not zero. The significance flag indicates, whether the previous update parameter is zero or not zero. The check can also be performed for each previous update parameter of a sequence of previous update parameters. For example, the decoder 10/encoder 11 is configured for checking, if the sequence of previous update parameters fulfills a predetermined criterion by considering respective significance flags of the previous update parameters 132', 132", wherein the respective significance flag of the respective previous update parameter indicates, whether the respective update parameter is zero or not zero. For example, the predetermined criterion is fulfilled, if for all previous update parameters of the sequence of previous update parameters the respective significance flag indicate that the respective previous update parameter is zero. This check may be further performed by additionally considering the NN parameter, e.g., by checking whether the NN parameter, e.g. the current NN parameter, is equal to zero.

The first probability model, for example, is a constant probability model, e.g. representing/indicating a constant probability, e.g. a probability of zero or a probability smaller than 0.1 or smaller than 0.05 or the minimal probability representable by the entropy decoder 30/encoder 31, or a predetermined probability representable by the entropy decoder 30/encoder 31, or the minimum probability representable in the entropy decoding/encoding by an entropy decoder 10/encoder 11 performing the entropy decoding/encoding, e.g. the minimum representable probability may depend on a configuration of the entropy decoder 10/encoder 11, which configuration is used for entropy decoding/encoding the update parameter 132. The first probability model, for example, indicates a constant probability for a predetermined syntax element, e.g. a significance flag, having a predetermined state, e.g., which indicates that the update parameter 132 is not zero. For example, the encoded representation 122 of the update parameter 132 may be represented by one or more syntax elements comprising the predetermined syntax element.

According to an embodiment, the decoder 10/encoder 11 is configured for, if the sequence of previous update parameters 132', 132" fulfills the predetermined criterion, selecting a second probability model as the probability model, e.g., one out of a set of probability models, e.g. a default model. The second probability model, for example, is a context model, or an adaptive model, or an adaptive context model.

4.3 Other Aspects/Variants/Embodiments

4.3.1 Enabling/Disabling

Per layer (or for multiple sets of layers, or subsets of layers), the encoder signals a flag (or another syntax element) to enable or disable the history deriver and the probability model selector 140. When they are disabled in an advantageous embodiment, the entropy decoder 30 always uses the default probability model.

The neural network comprises a plurality of layers. Referring to FIG. 1 and FIG. 2, the decoder 10/encoder 11 may be configured to decode/encode for each layer of the plurality of layers a respective update parameter set comprising one or more update parameters of the NN parameters associated with the respective layer. The decoder 10/encoder 11 may be configured for activating or deactivating, e.g., in response to an indication in the data stream 14, a selection of probability models for entropy decoding/encoding the update parameters on a per layer basis. The decoder 10/encoder 11 may be configured to decode/encode per layer an indication, which indicates whether the selection of probability models for the respective layer is to be activated or deactivated. In other words, the decoder 10/encoder 11 may be configured deriving/encoding, from/into the data stream, a syntax element, e.g. a flag, which indicates, whether the selection of probability models is to be activated or deactivated for update parameters of one or more of the layers, to which the indication, e.g., the syntax element, refers.

According to an embodiment, the decoder 10/encoder 11 may be configured for using a predetermined probability model 142, e.g., a default probability model, e.g. the second probability model, for the entropy decoding/encoding of all update parameters of one of the layers, if the selection is deactivated for the layer. Otherwise, if the selection is activated for the layer, the decoder 10/encoder 11 may be configured for selecting, for each of the update parameters of the layer, a respective probability model 142 in dependence on one or more previous update parameters 132', 132" for the NN parameter associated with the respective update parameter 132.

4.3.2 Special Probability Model

In other advantageous embodiments, the special model, e.g., the first probability model, is a context model, or an adaptive model, or an adaptive context model.

In another advantageous embodiment, the probability model selector 140 selects not only between the default and the special probability model, but from a set of probability models.

4.3.3 Alternative History Derivation

In a variant (V1) of the invention, the history deriver stores the received coefficients (e.g., information about the previous update parameters 132', 132" may be stored) or values derived of them, such that h(x,y,k) represents a set of coefficients (or derived values). Then, the probability model selector 140 uses h(x,y,k) to select the probability model 142 m(x,y,k), e.g. by logical and/or arithmetical operations (e.g., on previous update parameters 132', 132"), or e.g. by determining the number, e.g., a count, of non-zero coefficients (e.g., coefficients fulfilling a predetermined criterion, e.g., having a predetermined value or alternatively, not having a predetermined value, like not zero in this case), or e.g. by determining if any coefficient is not zero, or by determining if any of the previous update parameters does not fulfill the predetermined criterion, or by comparing to a threshold (e.g., comparing each of the previous update parameters 132', 132" to a threshold), or e.g. based on the values or absolute values of the coefficients or based on the combination of any means descripted before.

A variant (V2) of the invention operates similar to variant V1, but also discards coefficients from the set of coefficients, e.g. depending on the index of the update they belong to, or based on how many update layers have been receive since they have been added to the set of coefficients. The decoder 10/encoder 11, for example, is configured for storing information about a limited number of previous update parameters 132', 132" in the history data and, e.g., discarding the information about the earliest of the previous update parameters (e.g., 132"), if the limit is reached; in other words, the sequence of previous update parameters may comprise a limited number of previous update parameters.

In a variant of the invention, the history deriver counts the number of previous coefficients q(x,y,k) that fulfill a certain condition (e.g. being not equal to zero). The history data may include a parameter, which indicates a count of previous update parameters, see 132', 132", that fulfill a predetermined criterion, e.g. a parameter-related predetermined criterion, having a predetermined value, or alternatively, not having a predetermined value. Alternatively, the history data may include a parameter (e.g., h(x,y,k), e.g., the counted number, e.g., a result of a binary decision) which indicates, whether the sequence of previous update parameters, see 132', 132", fulfills a predetermined criterion, e.g., the predetermined criterion being fulfilled, if all previous update parameters equals a predetermined value, like zero.

In a variant of the invention, the history deriver derives h(x,y,k) with an infinite impulse response (IIR)-filter, e.g. providing an average of absolute values, or by any combination of h(x,y,k) and q(x,y,k) or values derived thereof. The decoder 10/encoder 11, for example, is configured for determining a parameter for the history data by subjecting a plurality of previous update parameters, e.g., 132' and 132", to an infinite impulse response (IIR)-filter, e.g., providing an average of absolute values.

4.3.4 History Reset

The history deriver resets h(x,y,k) to an initial history. In the advantageous embodiment E1, h(x,y,k) is set to zero. In variants V1 and V2, h(x,y,k) is set to an empty set. The history deriver resets the history (e.g., the decoder 10/encoder 11 may be configured for resetting the history data to a predetermined state), e.g. when one or more of the following is true:

When explicitly signaled (e.g., the decoder 10 may be configured for deriving an indication from the data stream 14, which indicates a reset of the history data. The indication, e.g., being encoded by the encoder 11 into the data stream 14, if a resetting condition is fulfilled).

When receiving the flag that indicates that the history deriver and the probability model selector 140 are disabled (e.g., the decoder 10 may be configured for deriving an indication from the data stream 14, which indicates a deactivation of the selecting of the probability model 142. The encoder 11 may be configured for deactivating the selecting of the probability model 142 and resetting the history data to a predetermined state, if a deactivation condition is fulfilled, and encoding, into the data stream 14, the indication, which indicates a deactivation of the selecting of the probability model 142).

After the decoder received a particular number of model updates (e.g., a count of the one or more previous update parameters 132', 132" received by the decoder 10/encoder 11 is greater than or equal to a predetermined count).

After q(x,y,k) has been equal to zero for a particular number of (e.g. consecutive) layer updates (e.g., a count of previous update parameters 132', 132", which fulfill a predetermined criterion, e.g., having a predetermined value, or alternatively, not having a predetermined value, is below a predetermined threshold, e.g., update parameter 132 the has been equal to zero for a particular number of (e.g. consecutive) layer updates).

The resetting condition, for example, is true, if any of the conditions of the set of conditions is fulfilled, or each condition of a subset of the set of conditions is fulfilled.

4.3.5 Others

In a variant of the invention, the probability model selector 140 selects the probability models 142 also for other bins not related to the sig_flag.

4.4 Exemplary Embodiment Based on the ICNN Standard

The following specification text shows an exemplary embodiment of the invention in the working draft of the upcoming ICNN standard [8]. The following variables/syntax elements are defined by the standard:

QuantParam[j]: The quantized parameter currently decoded sig_flag the significance flag sign_flag the sign flag ctxInc a variable specifying a context model, i.e. a probability model 4.4.1 Specification Changes 4.4.1.1 Added Definition Parameter Identifier: A value that uniquely identifies a parameter within an incremental update such that the same parameters in different incremental updates have the same parameter identifier.

NOTE: Parameters having the same parameter identifier are at the same position in the same tensor in different incremental updates. This means, they are co-located.

4.4.1.2 Additional Process after Decoding a Quantized Parameter (QuantParam[j])

The variable curParaId is set equal to the parameter identifier of the currently decoded parameter. QuantParam [i]. When no parameter with a parameter identifier equal to curParaId has been decoded before, the variable AnySigBeforeFlag[curParaId] is set equal to 0. The variable AnySigBeforeFlag[curParaId] is modified as follows:

$$AnySigBeforeFlag[curParaId] = AnySigBeforeFlag[curParaId] \| (QuantParam[I] \,!= 0)$$

4.4.1.3 Modification of the Derivation Process of ctxInc for the Syntax Element sig_flag Inputs to this process are the sig_flag decoded before the current sig_flag, the state value stateId, the associated sign_flag, if present, and, if present, the co-located parameter level (coLocParam) from the incremental update decoded before the current incremental update. If no sig_flag was decoded before the current sig_flag, it is inferred to be 0. If no sign flag associated with the previously decoded sig_flag was decoded, it is inferred to be 0. If no co-located parameter level from an incremental update decoded before the current incremental update is available, it is inferred to be 0. A co-located parameter level means the parameter level in the same tensor at the same position in previously decoded incremental update.

Output of this process is the variable ctxInc.

The variable curParaId is set equal to parameter identifier of the currently decoded parameter.

The variable ctxInc is derived as follows:

If AnySigBeforeFlag[curParaId] is equal 1, the following applies:
  ctxInc is set to stateId+40

Otherwise (AnySigBeforeFlag[curParaId] is equal to 0), the following applies:
  If coLocParam is equal to 0 the following applies:
    If sig_flag is equal to 0, ctxInc is set to stateId*3.
    Otherwise, if sign_flag is equal to 0, ctxInc is set to stateId*3+1.
    Otherwise, ctxInc is set to stateId*3+2.
  If coLocParam is not equal to 0 the following applies:
    If coLocParam is greater than 1 or less than −1, ctxInc is set to stateId*2+24.
    Otherwise, ctxInc is set to stateId*2+25.

4.4.2 Alternative Specification Changes

Instead of 4.4.1.2, after decoding a sig_flag:

The variable curParaId is set equal to the parameter identifier of the currently decoded sig_flag. When no parameter with a parameter identifier equal to curParaId has been decoded before, the variable AnySigBeforeFlag[curParaId] is set equal to 0. The variable AnySigBeforeFlag[curParaId] is modified as follows:

$$AnySigBeforeFlag[\ curParaId\ ] = AnySigBeforeFlag[\ curParaId\ ] \ \| \ \text{sig\_flag})$$

5 Methods According to the Above Described Principles

Although some aspects have been described in the context of an apparatus, it is clear that these aspects also represent a description of the corresponding method, where a block or device corresponds to a method step or a feature of a method step.

Figure 12:
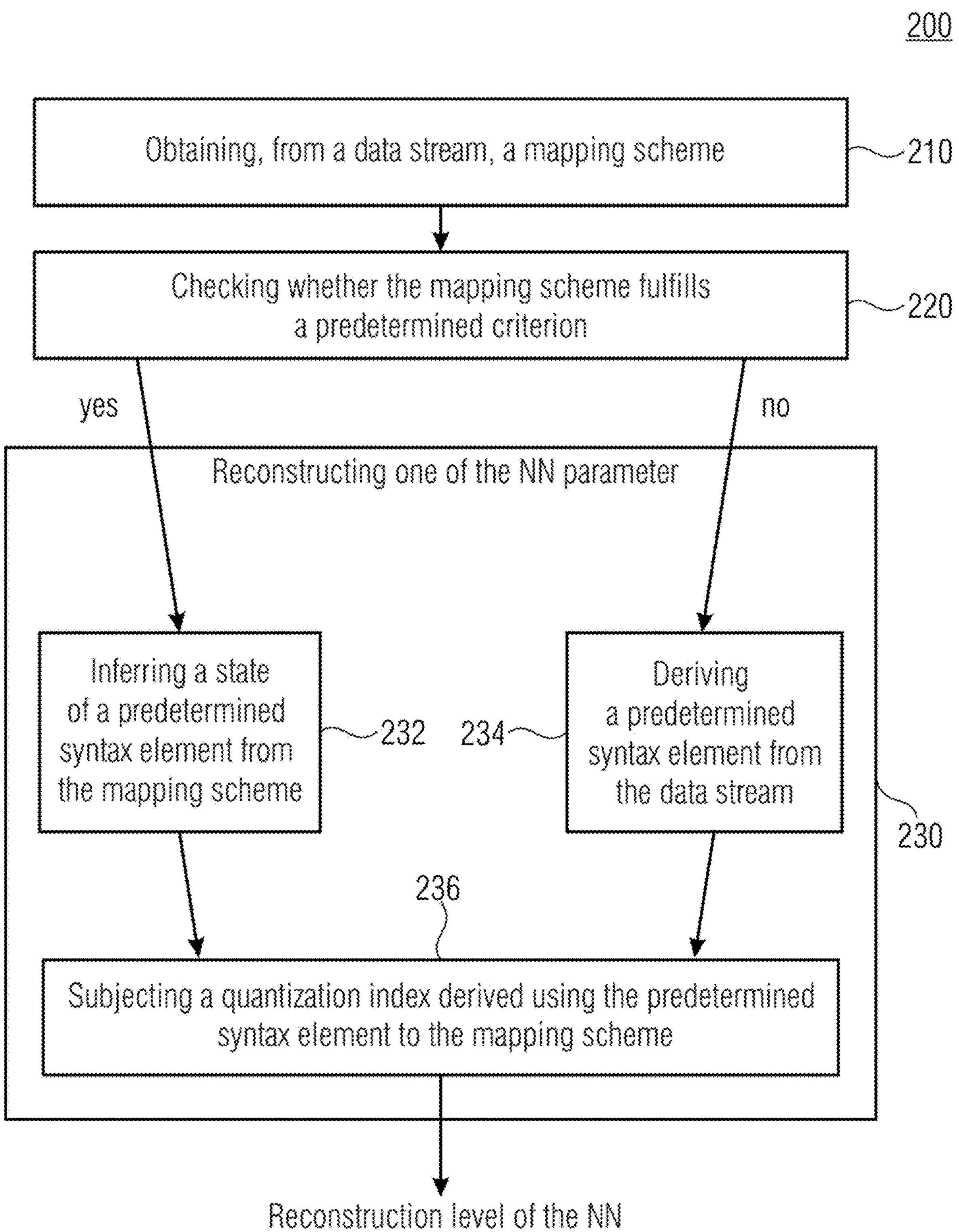
FIG. 12 shows an embodiment of a method for decoding NN parameters dependent on a mapping scheme.

FIG. 12 shows a method 200 for decoding neural network (NN) parameters, which define a neural network, from a data stream, the method 200 comprising obtaining 210, from the data stream, a mapping scheme for mapping quantization indices onto reconstruction levels. Further the method 200 comprises checking 220 whether the mapping scheme fulfills a predetermined criterion, and reconstructing 230 one of the NN parameters. The reconstructing 230 of one of the NN parameters is performed by if the mapping scheme fulfills the predetermined criterion, inferring 232 a state of a predetermined syntax element from the mapping scheme, and if the mapping scheme does not fulfill the predetermined criterion, deriving 234 the predetermined syntax element from the data stream, and subjecting 236 a quantization index derived using the predetermined syntax element to the mapping scheme so as to obtain a reconstruction level of the NN parameter.

The method 200 is based on the same principles as described with regard to the decoder 10 in section 3 above, wherein the method 200, for example, can comprise method steps corresponding to functionalities of the decoder 10.

Figure 13:
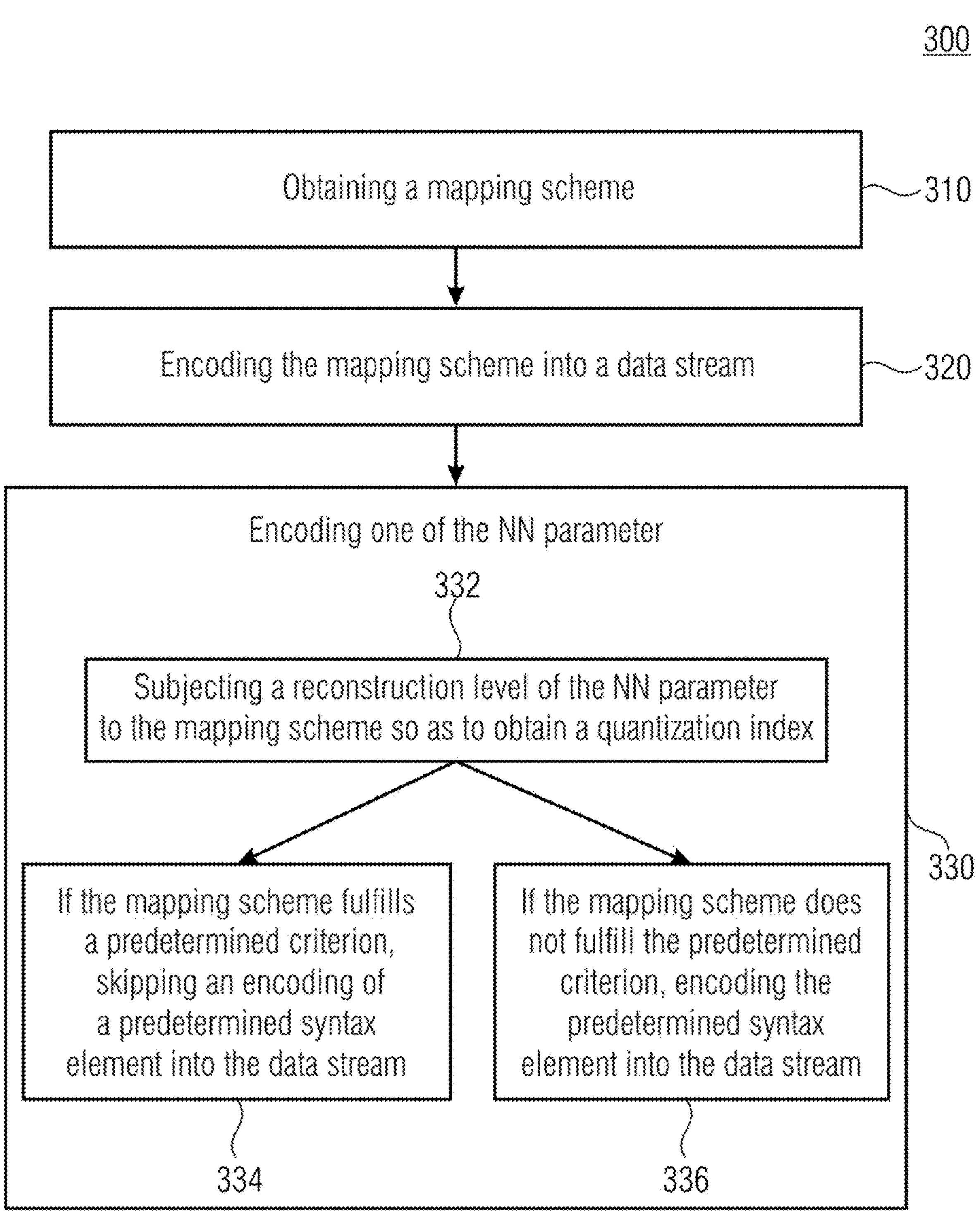
FIG. 13 shows an embodiment of a method for encoding NN parameters dependent on a mapping scheme.

FIG. 13 shows a method 300 for encoding neural network (NN) parameters, which define a neural network, into a data stream, the method 300 comprising obtaining 310 a mapping scheme for mapping reconstruction levels onto quantization indices, encoding 320 the mapping scheme into the data stream and encoding 330 one of the NN parameters. The encoding 330 of the one of the NN parameters is performed by subjecting a reconstruction level of the NN parameter to the mapping scheme so as to obtain a quantization index, and if the mapping scheme fulfills a predetermined criterion, skipping 334 an encoding of a predetermined syntax element into the data stream, wherein the predetermined syntax element is part of a representation of the quantization index, and if the mapping scheme does not fulfill the predetermined criterion, encoding 336 the predetermined syntax element into the data stream.

The method 300 is based on the same principles as described with regard to the encoder 11 in section 3 above, wherein the method 300, for example, can comprise method steps corresponding to functionalities of the encoder 11.

Figure 14:
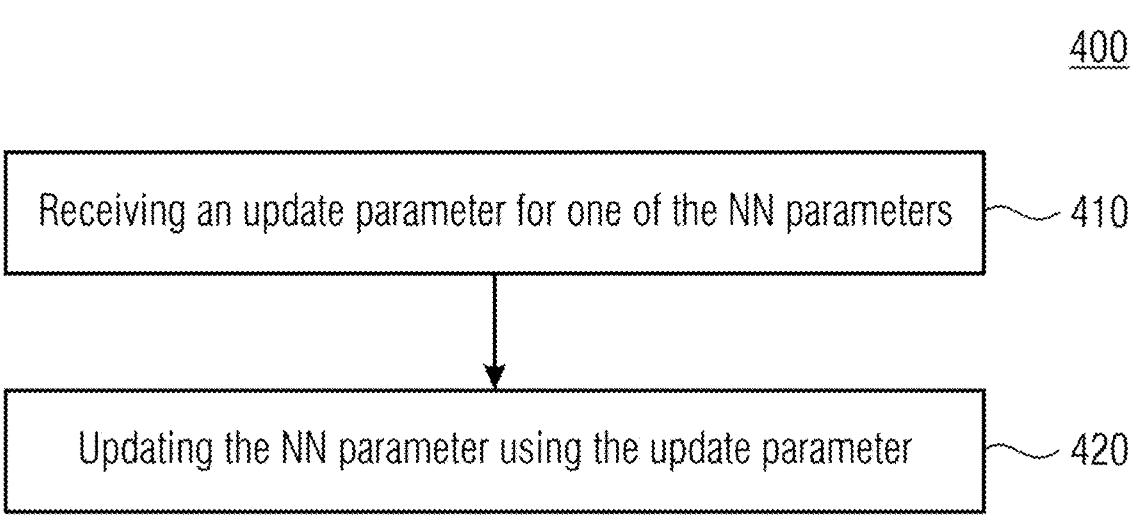
FIG. 14 shows an embodiment of a method for decoding update parameters for NN parameters.

FIG. 14 shows a method 400 for decoding neural network (NN) parameters, which define a neural network, from a data stream, the method 400 comprising receiving 410 an update parameter for one of the NN parameters, and updating 420 the NN parameter using the update parameter by entropy decoding the update parameter from the data stream by selecting a probability model for the entropy decoding of the update parameter in dependence on a sequence of previous update parameters for the NN parameter, and/or in dependence on the NN parameter.

The method 400 is based on the same principles as described with regard to the decoder 10 in section 4 above, wherein the method 400, for example, can comprise method steps corresponding to functionalities of the decoder 10.

Figure 15:
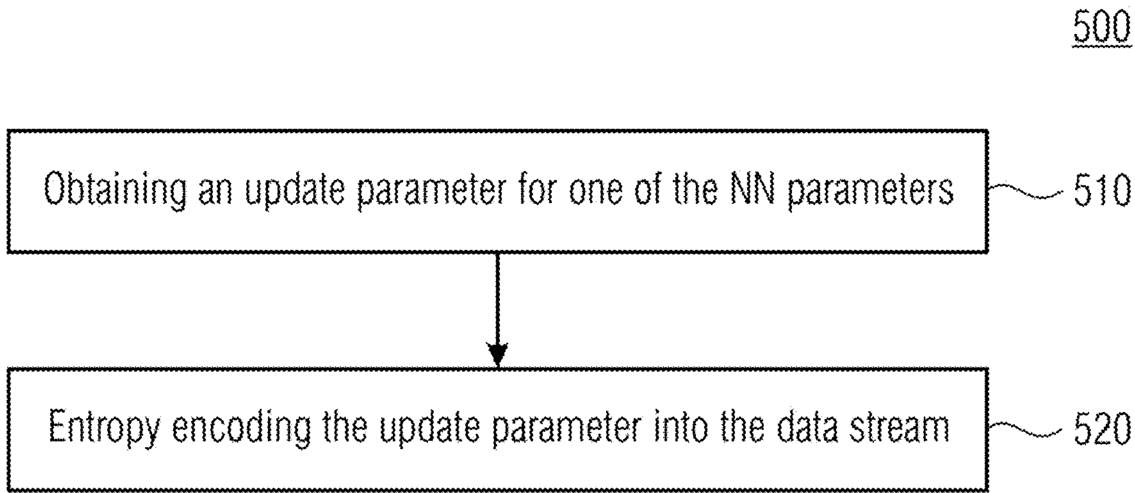
FIG. 15 shows an embodiment of a method for encoding update parameters for NN parameters.

FIG. 15 shows a method 500 for encoding neural network (NN) parameters, which define a neural network, into a data stream, the method 500 comprising obtaining 510 an update parameter for one of the NN parameters and entropy encoding 520 the update parameter into the data stream by selecting a probability model for the entropy encoding of the update parameter in dependence on a sequence of previous update parameters for the NN parameter, and/or in dependence on the NN parameter.

The method 500 is based on the same principles as described with regard to the encoder 11 in section 4 above, wherein the method 500, for example, can comprise method steps corresponding to functionalities of the encoder 11.

6 Implementation Alternatives

In this section, implementation alternatives of the embodiments described in the previous sections and described by the claims are described.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

Some or all of the method steps may be executed by (or using) a hardware apparatus, like for example, a microprocessor, a programmable computer or an electronic circuit. In some embodiments, one or more of the most important method steps may be executed by such an apparatus.

The inventive encoded signal can be stored on a digital storage medium or can be transmitted on a transmission medium such as a wireless transmission medium or a wired transmission medium such as the Internet. In other words, further embodiments provide a bitstream product including the bitstream according to any of the herein described embodiments, e.g. a digital storage medium having stored thereon the video bitstream.

Depending on certain implementation requirements, embodiments of the invention can be implemented in hardware or in software or at least partially in hardware or at least partially in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

The apparatus described herein may be implemented using a hardware apparatus, or using a computer, or using a combination of a hardware apparatus and a computer.

The methods described herein may be performed using a hardware apparatus, or using a computer, or using a combination of a hardware apparatus and a computer.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

7 References

[1] S. Chetlur et al., "cuDNN: Efficient Primitives for Deep Learning," arXiv: 1410.0759, 2014
[2] MPEG, "Text of ISO/IEC FDIS 15938-17 Compression of Neural Networks for Multimedia Content Description and Analysis", Document of ISO/IEC JTC1/SC29/WG11, w20331, OnLine, April 2021
[3] D. Marpe, H. Schwarz und T. Wiegand, "Context-Based Adaptive Binary Arithmetic Coding in the H.264/AVC Video Compression Standard," *IEEE transactions on circuits and systems for video technology*, Vol. 13, No. 7, pp. 620-636, July 2003.
[4] H. Kirchhoffer, J. Stegemann, D. Marpe, H. Schwarz und T. Wiegand, "JVET-K0430-v3—CE5-related: State-based probability estimator," in *JVET*, Ljubljana, 2018.
[5] ITU—International Telecommunication Union, "ITU-T H.265 High efficiency video coding," *Series H: Audiovisual and multimedia systems—Infrastructure of audiovisual services—Coding of moving video*, April 2015.
[6] B. Bross, J. Chen und S. Liu, "JVET-M1001-v6—Versatile Video Coding (Draft 4)," in *JVET*, Marrakech, 2019.
[7] S. Wiedemann et al., "DeepCABAC: A Universal Compression Algorithm for Deep Neural Networks," in IEEE Journal of Selected Topics in Signal Processing, vol. 14, no. 4, pp. 700-714, May 2020, doi: 10.1109/JSTSP.2020.2969554.
[8] "Working Draft 2 on Incremental Compression of Neural Networks" ISO/IEC/JTC29/WG4, w20933, October 2021.

The invention claimed is:

1. An apparatus for decoding neural network (NN) parameters, which define a neural network, from a data stream, configured for receiving an update parameter for one of the NN parameters, and updating the NN parameter using the update parameter, wherein the apparatus is configured for entropy decoding the update parameter from the data stream, wherein the apparatus is configured for selecting a probability model for the entropy decoding of the update parameter in dependence on a sequence of previous update parameters for the NN parameter, and/or in dependence on the NN parameter, wherein the update parameter and the one or more previous update parameters are part of a sequence of update parameters for the NN parameter, and wherein the apparatus is configured for sequentially updating the NN parameter based on the sequence of update parameters.

2. The apparatus according to claim 1, wherein the probability model is a context model, or an adaptive model, or an adaptive context model.

3. The apparatus according to claim 1, wherein the apparatus is configured for selecting the probability model for the entropy coding of the update parameter in dependence on history data, and entropy decoding the update parameter using the probability model, and updating the history data in dependence on the decoded update parameter.

4. The apparatus according to claim 3, configured for storing information about the previous update parameters in the history data.

5. The apparatus according to claim 4, configured for storing information about a limited number of previous update parameters in the history data.

6. The apparatus according to claim 3, configured for determining a parameter for the history data by subjecting a plurality of previous update parameters to an infinite impulse response-filter.

7. The apparatus according to claim 3, wherein the history data comprise a parameter, which indicates, whether the sequence of previous update parameters fulfills a predetermined criterion.

8. The apparatus according to claim 7, wherein the predetermined criterion is fulfilled, if all of the previous update parameters of the sequence comprise a predetermined value.

9. The apparatus according to claim 7, wherein the first probability model is a constant probability model indicating a probability of zero or the minimum probability representable in the entropy decoding for a predetermined syntax element comprising a predetermined state.

10. The apparatus according to claim 7, configured for checking, if the sequence of previous update parameters fulfills the predetermined criterion, by considering respective significance flags of the previous update parameters, wherein the significance flag of one of the previous update parameter indicates, whether the update parameter is zero or not zero.

11. The apparatus according to claim 7, configured for checking, if the sequence of previous update parameters fulfills the predetermined criterion, on the basis of the NN parameter.

12. The apparatus according to claim 3, wherein the history data comprise a parameter, which indicates a count of previous update parameters that fulfill a predetermined criterion.

13. The apparatus according to claim 12, configured for checking if one of the previous update parameters comprises the predetermined value by considering a significance flag for the previous update parameter, which indicates whether the update parameter is zero or not zero, wherein the significance flag indicates, whether the update parameter is zero or not zero.

14. The apparatus according to claim 3, configured for resetting the history data to a predetermined state, if a resetting condition is fulfilled, wherein the resetting condition depends on a set of conditions comprising one or more of the following:

the apparatus deriving an indication from the data stream, which indicates a reset of the history data, the apparatus deriving an indication from the data stream, which indicates a deactivation of the selecting of the probability model, a count of the one or more previous update parameters received by the apparatus is greater than or equal to a predetermined count, a count of previous update parameters, which fulfill a further predetermined criterion is below a predetermined threshold, wherein the resetting condition is true, if any of the conditions of the set of conditions is fulfilled, or each condition of a subset of the set of conditions is fulfilled.

15. The apparatus according to claim 1, configured for updating the history data, and/or selecting the probability model by one or more of performing a logical and/or arithmetical operation on the previous update parameters, determining a number of the previous update parameters fulfilling a further predetermined criterion, determining if any of the previous update parameters does not fulfill the predetermined criterion, comparing each of the previous update parameters to a threshold.

16. The apparatus according to claim 1, wherein the apparatus is configured for selecting a first probability model for the entropy decoding of the update parameter, if the sequence of previous update parameters does not fulfill a predetermined criterion.

17. The apparatus according to claim 16, wherein the first probability model is a constant probability model.

18. The apparatus according to claim 16, wherein the first probability model is a context model, or an adaptive model, or an adaptive context model.

19. The apparatus according to claim 16, wherein the apparatus is configured for, if the sequence of previous update parameters fulfills the predetermined criterion, selecting a second probability model as the probability model.

20. The apparatus according to claim 19, wherein the second probability model is a context model, or an adaptive model, or an adaptive context model.

21. The apparatus according to claim 1, wherein the apparatus is configured for selecting a first probability model for the entropy decoding of the update parameter, if the sequence of previous update parameters does not fulfill a predetermined criterion, updating a history parameter, which indicates whether or not the sequence of previous update parameters fulfills the predetermined criterion, in dependence on the update parameter by if the history parameter comprises a first value, which indicates that the predetermined criterion is not fulfilled, or if the update parameter does not comprise a predetermined value, setting the history parameter to the first value, if the update parameter comprises the predetermined value, and the history parameter comprises a second value, which indicates that the predetermined criterion is fulfilled, setting the history parameter to the second value.

22. The apparatus according to claim 21, configured for selecting a first probability model for an entropy decoding of a subsequent update parameter of the NN parameter, if the history parameter comprises the first value and selecting a second probability model for the entropy decoding of the subsequent update parameter of the NN parameter, if the history parameter comprises the second value.

23. The apparatus according to claim 1, wherein the apparatus is configured for deriving, from the data stream, an update parameter set comprising, for a plurality of the NN parameters, a plurality of respective update parameters, and for updating the NN parameters using the respective update parameters, wherein the apparatus is configured for selecting, for each of the update parameters, a respective probability model in dependence on one or more previous update parameters for the respective NN parameter.

24. The apparatus according to claim 1, wherein the neural network comprises a plurality of layers, and wherein respective update parameter sets for the layers each comprise one or more of the NN parameters, and wherein the apparatus is configured for activating or deactivating a selection of probability models for entropy decoding the update parameters on a per layer basis.

25. The apparatus according to claim 24, wherein the apparatus is configured for deriving, from the data stream, a syntax element which indicates, whether the selection of probability models is to be activated or deactivated for update parameters of one or more of the layers, to which the indication refers.

26. The apparatus according to claim 24, wherein the apparatus is configured for using a predetermined probability model for the entropy decoding of all update parameters of one of the layers, if the selection is deactivated for the layer, and selecting, for each of the update parameters of the layer, a respective probability model in dependence on one or more previous update parameters for the NN parameter associated with the respective update parameter, if the selection is activated.

27. The apparatus according to claim 1, configured for using the probability model for entropy decoding a significance flag, which indicates, whether the update parameter is zero or not zero.

28. The apparatus according to claim 1, configured for updating the NN parameter using the update parameter by combining the NN parameter and the update parameter, or multiplying the NN parameter and the update parameter, or replacing the NN parameter with the update parameter.

29. An apparatus for encoding neural network (NN) parameters, which define a neural network, into a data stream, configured for acquiring an update parameter for one of the NN parameters, wherein the apparatus is configured for entropy encoding the update parameter into the data stream, wherein the apparatus is configured for selecting a probability model for the entropy encoding of the update parameter in dependence on a sequence of previous update parameters for the NN parameter, and/or in dependence on the NN parameter, wherein the update parameter (132) and the one or more previous update parameters (132', 132") are part of a sequence of update parameters for the NN parameter.

30. A method for decoding neural network (NN) parameters, which define a neural network, from a data stream, the method comprising:

receiving an update parameter for one of the NN parameters, and updating the NN parameter using the update parameter by entropy decoding the update parameter from the data stream by selecting a probability model for the entropy decoding of the update parameter in dependence on a sequence of previous update parameters for the NN parameter, and/or in dependence on the NN parameter.

31. A method for encoding neural network (NN) parameters, which define a neural network, into a data stream, the method comprising:

acquiring an update parameter for one of the NN parameters, entropy encoding the update parameter into the data stream by selecting a probability model for the entropy encoding of the update parameter in dependence on a sequence of previous update parameters for the NN parameter, and/or in dependence on the NN parameter.

32. A data stream having encoded thereinto update parameters for encoding neural network (NN) parameters, which define a neural network, the update parameters being encoded into the data stream by acquiring an update parameter for one of the NN parameters, entropy encoding the update parameter into the data stream by selecting a probability model for the entropy encoding of the update parameter in dependence on a sequence of previous update parameters for the NN parameter, and/or in dependence on the NN parameter, wherein the update parameter (132) and the one or more previous update parameters (132', 132") are part of a sequence of update parameters for the NN parameter.

33. A non-transitory digital storage medium having stored thereon a computer program for implementing a method for decoding neural network (NN) parameters, which define a neural network, from a data stream, the method comprising:

receiving an update parameter for one of the NN parameters, and updating the NN parameter using the update parameter by entropy decoding the update parameter from the data stream by selecting a probability model for the entropy decoding of the update parameter in dependence on a sequence of previous update parameters for the NN parameter, and/or in dependence on the NN parameter, wherein the update parameter and the one or more previous update parameters are part of a sequence of update parameters for the NN parameter, and wherein the apparatus is configured for sequentially updating the NN parameter based on the sequence of update parameters, when the computer program is run by a computer or signal processor.

34. A non-transitory digital storage medium having stored thereon a computer program for implementing a method for encoding neural network (NN) parameters, which define a neural network, into a data stream, the method comprising:

acquiring an update parameter for one of the NN parameters, entropy encoding the update parameter into the data stream by selecting a probability model for the entropy encoding of the update parameter in dependence on a sequence of previous update parameters for the NN parameter, and/or in dependence on the NN parameter, wherein the update parameter (132) and the one or more previous update parameters (132', 132") are part of a sequence of update parameters for the NN parameter, when the computer program is run by a computer or signal processor.

* * * * *